(12) United States Patent
Hai

(10) Patent No.: US 9,140,727 B2
(45) Date of Patent: Sep. 22, 2015

(54) CURRENT MONITOR FOR INDICATING CONDITION OF ATTACHED ELECTRICAL APPARATUS

(71) Applicant: Justin Hai, San Diego, CA (US)

(72) Inventor: Justin Hai, San Diego, CA (US)

(73) Assignee: GREEN FITNESS EQUIPMENT COMPANY, LLC, Del Mar, CA (US)

( * ) Notice: Subject to any disclaimer, the term of this patent is extended or adjusted under 35 U.S.C. 154(b) by 223 days.

(21) Appl. No.: 13/775,019

(22) Filed: Feb. 22, 2013

(65) Prior Publication Data

US 2013/0173192 A1 Jul. 4, 2013

Related U.S. Application Data

(63) Continuation-in-part of application No. 13/277,169, filed on Oct. 19, 2011, now Pat. No. 8,884,553, and a continuation-in-part of application No. PCT/US2012/061189, filed on Oct. 19, 2012.

(60) Provisional application No. 61/603,162, filed on Feb. 24, 2012.

(51) Int. Cl.
  *G01R 19/25* (2006.01)
  *G01R 19/165* (2006.01)
  (Continued)

(52) U.S. Cl.
  CPC ...... *G01R 19/2506* (2013.01); *G01R 19/16595* (2013.01); *A63B 22/0056* (2013.01); *A63B 22/02* (2013.01); *A63B 22/0605* (2013.01); *A63B 22/0664* (2013.01); *A63B 2225/30* (2013.01)

(58) Field of Classification Search
  CPC .................................................. G01R 19/2506

USPC ......... 315/312, 291, 308, 200 R; 702/57, 58, 702/59, 60, 61–65, 67–68
See application file for complete search history.

(56) References Cited

U.S. PATENT DOCUMENTS 7,423,546 B1 * 9/2008 Aisa .............................. 340/679
8,350,417 B1 1/2013 Dooley et al.
(Continued)

FOREIGN PATENT DOCUMENTS

| JP | 09-116231 | 5/1997 |
|----|-----------|--------|
| JP | 2009-128130 A | 6/2009 |
| KR | 2011-0032934 A | 3/2011 |

OTHER PUBLICATIONS

PCT International Search Report and Written Opinion dated Mar. 28, 2013 for PCT application No. PCT/US2012/061189.
(Continued)

*Primary Examiner* — Minh D A
(74) *Attorney, Agent, or Firm* — Mintz Levin Cohn Ferris Glovsky and Popeo, P.C.

(57) ABSTRACT

A current monitor is described that indicates a condition of attached electrical equipment. The current monitor can determine a predetermined range in which current being withdrawn by the attached electrical apparatus lies. Based on the determined range, corresponding display electronic elements, such as light emitting diodes (LEDs), can be activated. Activated LEDs of a particular color can indicate corresponding conditions of the electrical equipment. The condition of the electrical equipment along with other parameters, such as associated time ranges and other values, can be transmitted via a wired or wireless connection to a software system implemented on a wireless device such that a continuous monitoring and an analysis can be performed remotely. Related apparatus, systems, techniques and articles are also described.

11 Claims, 68 Drawing Sheets

(51) Int. Cl.
*A63B 22/00* (2006.01)
*A63B 22/02* (2006.01)
*A63B 22/06* (2006.01)

(56) References Cited

U.S. PATENT DOCUMENTS

| | | | |
|---|---|---|---|
| 8,884,553 B2 * | 11/2014 | Hai | 315/312 |
| 2004/0124338 A1 * | 7/2004 | Cloutier et al. | 250/214 C |
| 2006/0082322 A1 * | 4/2006 | Morishita | 315/200 A |
| 2009/0088991 A1 * | 4/2009 | Brzezowski et al. | 702/62 |
| 2009/0160427 A1 | 6/2009 | Drake et al. | |
| 2010/0109888 A1 | 5/2010 | Ansaldi et al. | |
| 2010/0156176 A1 | 6/2010 | Kim et al. | |
| 2011/0109245 A1 * | 5/2011 | Lin et al. | 315/294 |
| 2011/0144932 A1 | 6/2011 | Alles | |
| 2011/0238988 A1 * | 9/2011 | Tanaka et al. | 713/168 |
| 2012/0037725 A1 * | 2/2012 | Verfuerth | 239/289 |
| 2012/0323510 A1 | 12/2012 | Bell et al. | |

OTHER PUBLICATIONS

PCT International Search Report dated May 21, 2014, for PCT application No. PCT/US2014/017625.

* cited by examiner

CURRENT MONITOR FOR INDICATING CONDITION OF ATTACHED ELECTRICAL APPARATUS

RELATED APPLICATIONS

This application is a continuation-in-part of and claims priority to co-pending U.S. patent application Ser. No. 13/277,169, entitled "Current Monitor for Indicating Condition of Attached Electrical Apparatus," filed Oct. 19, 2011. This application also claims priority to co-pending PCT Patent Application Serial No. PCT/US2012/061189, entitled "Current Monitor for Indicating Condition of Attached Electrical Apparatus," filed Oct. 19, 2012, which further claims priority to U.S. Provisional Patent Application 61/603,162, entitled "Current Monitor for Indicating Condition of Attached Electrical Apparatus to a Remote Device," filed Feb. 24, 2012. The disclosures of all the above-referred patent applications are hereby incorporated by reference in their entirety.

TECHNICAL FIELD

The subject matter described herein relates to current monitor that indicates a condition and other parameters of attached electrical apparatus/equipment. More specifically, the current monitor indicates, via either a wired connection or a wireless protocol, the condition and other parameters based on a range in which current withdrawn by the attached electrical apparatus lies.

BACKGROUND

Electrical equipment requires regular lubrication, airflow and maintenance to ensure an efficient and a safe operation. Such electrical equipment includes gym equipment, such as cardiovascular exercise equipment including treadmills, steppers, ellipticals, exercise bikes, rowing machines, and the like. When a user of the electrical equipment (e.g. the treadmill) starts the electrical equipment and subsequently performs exercise (e.g. walk, jog, or run on the treadmill) on the electrical equipment, stress/load is created with every movement associated with the exercise. When the electrical equipment operates, friction is generated between various components of the electrical equipment. As the stress/load increases, the friction increases, thereby producing undesirable heat. The electrical equipment may be lubricated using a lubrication product. However, as the lubrication wears out, more friction and more stress are caused on the various components of the electrical equipment. This increased stress causes more power to be utilized by the electrical equipment to perform work that is performed using less power when the electrical equipment is well lubricated, is maintained, and/or has a sufficient airflow. An increased power input results in increased current input. The increase in current can increase the amount of heat generated within the electrical equipment. This increased amount of heat can be due to an increased use of the motor within the electrical equipment, or due to other such mechanical reasons. This heat increase can cause a failure or damage of the electrical/electronic circuitry within the electrical equipment or failure or damage of other mechanical parts associated with the electrical equipment. In addition to the repair or replacement of the various components of the electrical equipment and/or the repair or replacement of the circuitry being generally expensive, if the failure and/or damage occurs suddenly when an individual is using the electrical equipment (e.g. treadmill), the sudden failure/damage can cause serious injury to the individual.

SUMMARY

In one aspect, a receiver of a management system can receive values of current utilized by an electrical equipment and corresponding timestamps from a current monitor monitoring the current. A database of the management system can store the values of the current and the timestamps. One or more processors of the management system can perform, using the stored values of the current and the timestamps, a statistical analysis to generate a graphical report. The generated report can characterize a performance of the electrical equipment.

The graphical report can be displayed on a user interface of the management system. The graphical report can be transmitted to and displayed on a user interface of a mobile computing device that can be remotely connected to the management system via a communication network.

An alarm generator of the management system can generate an alarm to alert a user when the received values of the current are below a threshold. The alarm can include at least one of: a notification, a short message service (SMS) message, email, and a social network notification.

One or more processors executing one or more predictive models can predict, based on the values of the current and the timestamps, a current intake by the electrical equipment at a specific time in future. The current intake at the specific time in future can characterize a predicted performance of the electrical equipment at the specific time in future. The one of more predictive models can perform prediction based on one or more of: a nearest neighbor algorithm, a majority classifier, a support vector machine, a logistic regression, and an uplift modeling.

An alarm generator of the management system can generate an alarm to alert a user when the current intake at the specific time in future is more than a threshold. The alarm can include at least one of: a notification, a short message service (SMS) message, email, and a social network notification.

On a user interface of the management system, a feedback provided by a user on a graphic user interface of a mobile computing device of the user can be received. The feedback can include at least one of: one or more suggestions for at least one of improvements and errors in the graphical report, and one or more recommendations for performing a maintenance of the electrical equipment.

In another aspect, current from a power source can be obtained at an electrical circuit in accordance with a current requirement of an electrical equipment. An ammeter within the electrical circuit can measure, at a plurality of times, values of the obtained current. A transmitter within the electrical circuit can transmit, to a management system, the values of the obtained current and timestamps characterizing the times when the current values are measured.

The values of the current and the timestamps can be transmitted to the management system in real-time. The transmission can be via a communication network. In another implementation, the values of the current and the timestamps can be transmitted to the management system after regular intervals of time. This transmission can also be via a communication network.

The management system can be configured to: receive, by a receiver of the management system, the transmitted values of the current and the corresponding timestamps; store, in a database associated with the management system, the values of the current and the timestamps; perform, by one or more processors of the management system and using the stored values of the current and the timestamps, a statistical analysis to generate a graphical report, the generated report characterizing a performance of the electrical equipment; predict, using one or more predictive models and based on the statistical analysis, a current intake by the electrical equipment at a specific time in future, the current intake at the specific time in future characterizing a predicted performance of the electrical equipment at the specific time in future; and generate, by an alarm generator within the management system, an alarm to alert a user when the current intake at the specific time in future is more than a predetermined threshold.

Using the electrical circuit, the obtained current can be compared with at least one of a first threshold and a second threshold. If the obtained current is less than a first threshold, one or more light emitting diodes of a first color can be activated. If the obtained current is equal to or more than the first threshold and is less than a second threshold, one or more light emitting diodes of a second color can be activated. If the obtained current is equal to or more than the second threshold, one or more light emitting diodes of a third color can be activated. At least one of the first threshold and the second threshold can be user-adjustable. The electrical circuit can further include a test component that provides a mechanism to determine that the electrical circuit is functioning properly. The electrical circuit can include one or more multichannel switches to control activation of one of the one or more light emitting diodes of the first color, the one or more light emitting diodes of the second color, and the one or more light emitting diodes of the third color. The electrical circuit can include a latching mechanism that enables the color of the activated one or more light emitting diodes to be retained after the electrical equipment stops being used. The latching mechanism can be reset by disconnecting the electrical circuit from the power source. The retained color can be latched until the latching mechanism is reset. Previously deactivated one or more light emitting diodes can be disabled from reactivation until the latching mechanism is reset.

In yet another aspect, an electrical circuit is described. The electrical circuit can include an alternating current to direct current converter, at least one comparator, a light emitting diode drive, and a transmitter. The alternating current to direct current converter can convert received alternating current to a direct current. The at least one comparator can compare the direct current to one or more thresholds used to identify a corresponding range of current of ranges of current. The light emitting diode drive can activate one or more light emitting diodes of a color corresponding to the identified range of current. The transmitter can transmit values of at least one of the alternating current and the direct current to a management system. The management system can perform a statistical analysis to generate a graphical report characterizing a performance of the electrical equipment.

The electrical circuit can further include one or more multichannel switches that can control the activation of the one or more light emitting diodes of the corresponding color. The identified range of current can be associated with at least one threshold. The at least one threshold can be user-adjustable.

The electric circuit can further include one or more latches that can enable the electrical circuit to retain the color corresponding to the identified range of current after an electrical equipment requiring the received alternating current stops being used. The retained color can be reset by disconnecting the electrical circuit from a power source supplying the alternating current. The retained color can correspond to a range of current associated with at least one threshold. The retained color may not change to a color associated with a lower threshold until the latching mechanism is reset.

Articles of manufacture are also described that comprise computer executable instructions permanently stored on computer readable media, which, when executed by a computer, causes the computer to perform operations herein. Similarly, computer systems are also described that may include a processor and a memory coupled to the processor. The memory may temporarily or permanently store one or more programs that cause the processor to perform one or more of the operations described herein.

The subject matter described herein provides many advantages. For example, the current monitor prevents failure and/or damage of electrical/electronic circuitry within the electrical equipment, wherein the failure and/or damage can arise due to heating-of the circuitry caused by an increase of current used by the electrical equipment. Moreover, the current monitoring by the current monitor can prevent serious injury to a user of the electrical equipment, as a critical condition (e.g. condition of electrical equipment when excessive current is withdrawn) can be clearly identified from a distance by noting the color of the LED displayed by the electrical equipment.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

Figure 1:
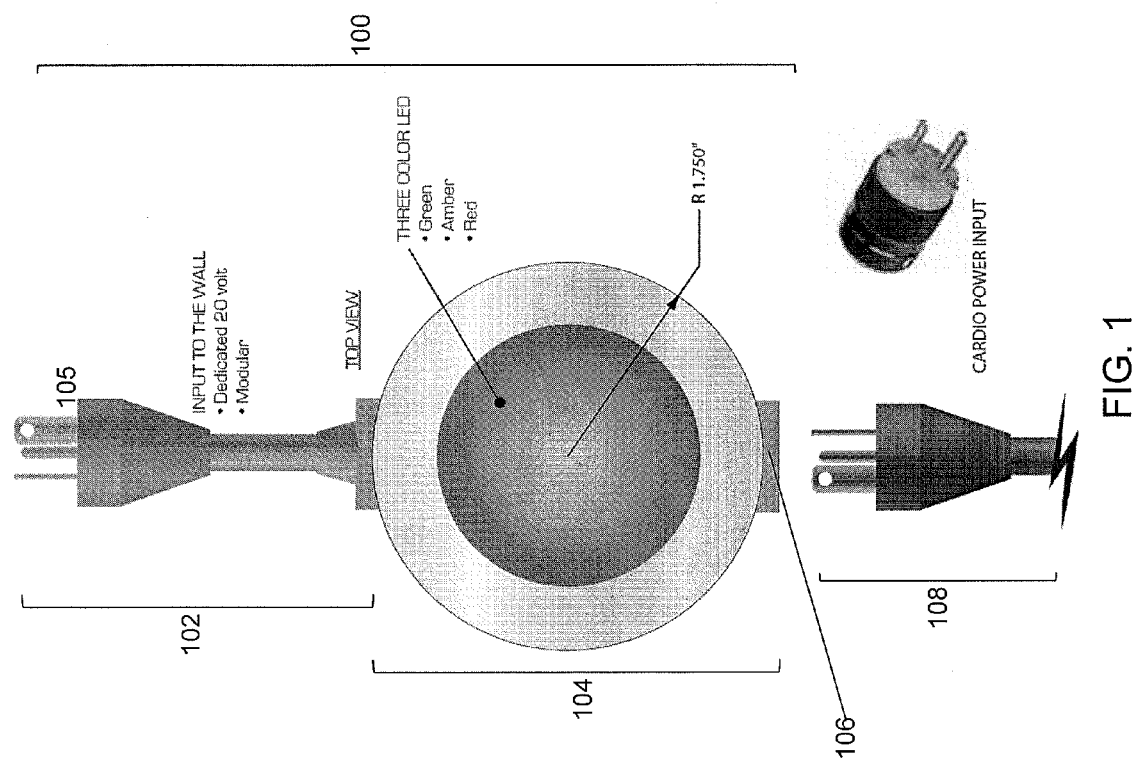
FIG. 1 illustrates a top view of a current monitoring apparatus in accordance with some implementations of the current subject matter.

A current monitor is described that indicates a condition of attached electrical apparatus/equipment. The current monitor can determine a predetermined range in which current being withdrawn by the attached electrical equipment lies. Based on the determined range, corresponding display electrical/electronic elements, such as light emitting diodes (LEDs), can be activated. Activation of a light emitting diode (LED), as mentioned herein, refers to electroluminescence by the LED. The color of the LED refers to the color associated with the electroluminescence, wherein the color of the electroluminescence is determined by an energy gap of a semiconductor forming the LED.

The activation of LEDs can be explained with the following exemplary implementation: (1) when less current is being withdrawn by the electrical equipment, one or more green LEDs can be activated; (2) when more current is being withdrawn by the electrical equipment, one or more amber/yellow LEDs can be activated; and (3) when even more (e.g. excessive or more than normal) current is being withdrawn by the electrical equipment, one or more red LEDs can be activated. LEDs of a particular color can indicate corresponding conditions of the electrical equipment. For example, (1) activation of one or more green LEDs can indicate normal functioning of the electrical equipment; (2) activation of one or more amber/yellow LEDs can indicate that lubrication of the electrical equipment is required soon; and (3) activation of one or more red LEDs can indicate that lubrication of the electrical equipment is required, condition of the electrical equipment is critical, and the electrical equipment may not be used to avoid damage and/or failure due to overheating of the electrical/electronic circuitry associated with the electrical equipment. Further, (1) activation of one or more green LEDs can indicate that current being withdrawn by the electrical equipment is normal; (2) activation of one or more amber/yellow LEDs can indicate that current being withdrawn by the electrical equipment can be more than a first percentage or predetermined threshold above current withdrawn during normal functioning of the electrical equipment but can be less than a second percentage or predetermined threshold above the current withdrawn during normal functioning, wherein the first percentage or predetermined threshold can be provided by either a manufacturer of the electrical equipment or a manufacturer of the control monitoring apparatus; and (3) activation of one or more red LEDs can indicate that current being withdrawn by the electrical equipment is more than a second percentage or predetermined threshold above normal, wherein this second percentage or predetermined threshold can be provided by either a manufacturer of the electrical equipment or a manufacturer of the control monitoring apparatus. Typically, the value of the first percentage or predetermined threshold can be between 10% and 20% (for example, 20%), or between 3 amperes and 6 amperes (for example, 5 amperes) and the value of the second percentage or predetermined threshold can be any predetermined value more than the first percentage or predetermined threshold (for example, between 20% and 40%, or alternatively 40%, or between 6 amperes and 8 amperes, or alternatively 7 amperes). These noted ranges are exemplary, and can be varied by an administrator or a user.

FIG. 1 illustrates a top view of a current monitoring apparatus 100 in accordance with some implementations of the current subject matter. The current monitoring apparatus 100 can include a connector 102, a current monitor 104, and a female connector 106. One side of the connector 102 can be a male port/plug 105 that goes into a socket in a wall. Other side of the connector 102 can be a female port that can be connected to a male port 902 (described below with respect to FIGS. 9 and 10) of current monitor 104. The female connector 106 can be connected to a male connector (e.g. plug) 108 of an electrical equipment, such as a cardiovascular equipment (e.g. treadmill). Thus, when the electrical equipment is functional, the current withdrawn by the electrical equipment can pass through the current monitoring apparatus 100.

The current monitor 104 can comprise electrical/electronic circuitry including one or more green LEDs, one or more amber/yellow LEDs, and one or more red LEDs. When less current is withdrawn by the electrical equipment, one or more green LEDs can be activated, thereby indicating normal functioning of the electrical equipment. When more current is withdrawn by the electrical equipment, one or more amber/yellow LEDs can be activated, thereby indicating that lubrication of the electrical equipment can be required soon. When even more current is withdrawn by the electrical equipment, one or more red LEDs can be activated, thereby indicating that lubrication of the electrical equipment is required and that the electrical equipment should not be used to avoid damage/failure due to overheating of the electrical/electronic circuitry associated with the electrical equipment. Although three different colored LEDs are described, one of ordinary skill in the art understands that either two different colors or more than three different colors of LEDs can be used to indicate corresponding electrical equipment conditions based on the current being withdrawn by the electrical equipment.

Figure 2:
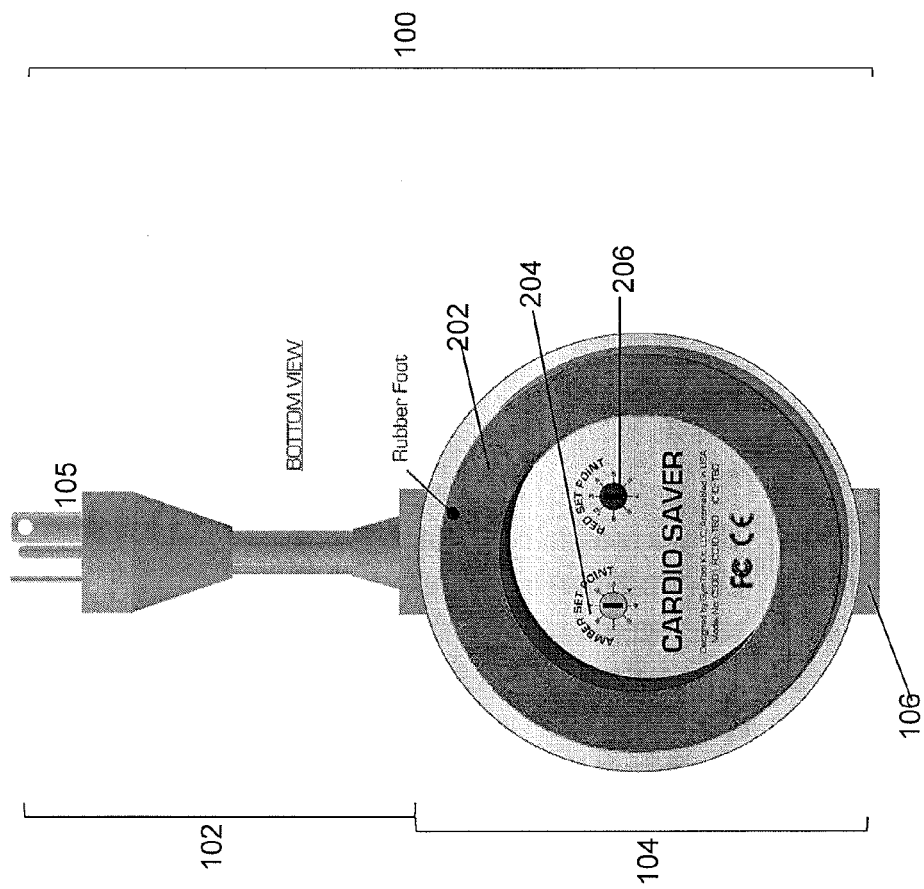
FIG. 2 illustrates a bottom view of a current monitoring apparatus in accordance with some implementations of the current subject matter.

FIG. 2 illustrates a bottom view of a current monitoring apparatus 100 in accordance with some implementations of the current subject matter. The current monitor 104 can include a rubber coating 202 that electrically insulates the outer surface of the current monitor 104. Further, when electrical equipment withdraws current that is more than usually withdrawn, the rubber coating 202 can absorb the generated heat and can prevent the electrical/electronic circuitry within the current monitor 104 from failing or getting damaged. Moreover, the rubber coating 202 can prevent an electric shock to an individual, if the individual gets in a direct contact (e.g. by touch) with the current monitor 104.

Further, the current monitor 104 can comprise an amber set point control 204 to set an amber/yellow set point and a red set point control 206 to set a red set point. Both the amber/yellow set point and the red set point can be individually set by a technician in accordance with technical specifications that can be provided by manufacturer or technician associated with the electrical equipment. Thus, at least one end point (e.g. at least one of amber/yellow set point and the red set point) for a current range, where one or more LEDs of a particular color can be activated while previously activated one or more LEDs of another color can be deactivated, can be user-defined. A value of current that is set using control 204 can be a value, for which one or more amber/yellow LEDs can be activated and the one or more green LEDs can be deactivated, thereby indicating that lubrication is required-soon for values of withdrawn current that are equal to or more than the value set by control 204. A value of current that is set using control 206 can be a value, for which one or more red LEDs can be activated and the previously-activated one or more amber/yellow LEDs can be deactivated, thereby indicating that lubrication is required and that use of the electrical equipment may not be recommended for values of withdrawn current that can be equal to or more than the value set by control 206. Although the color is described above to change when withdrawn-current equals a threshold set by controls (204, 206), in some other implementations, the color remains the same when withdrawn-current equals the threshold and changes when the withdrawn-current exceeds the threshold.

Figure 3:
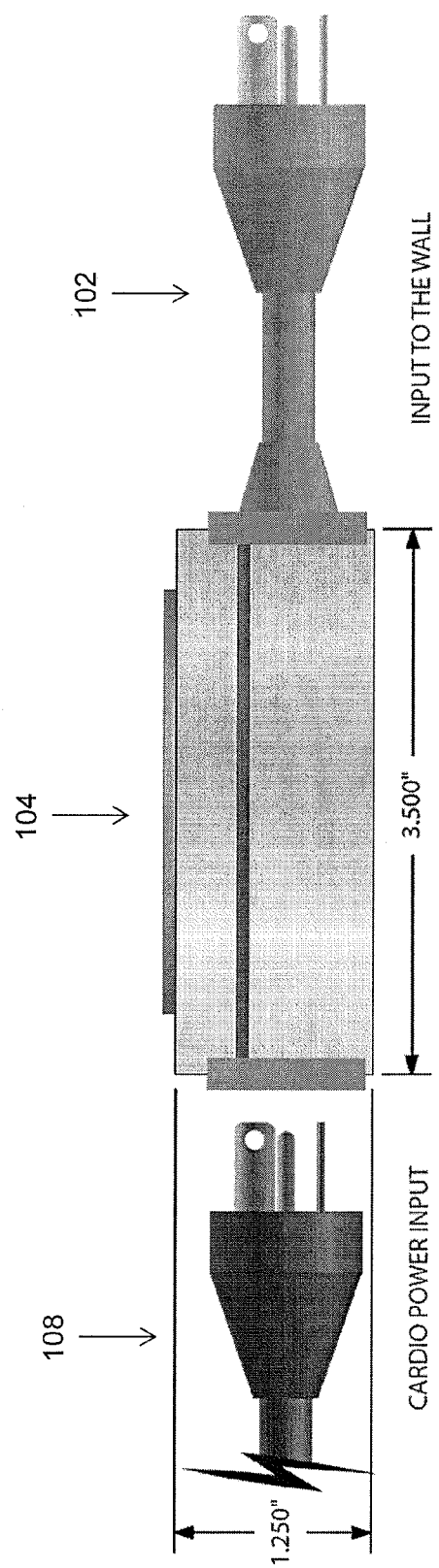
FIG. 3 illustrates a side view of the current monitoring apparatus in accordance with some implementations of the current subject matter.

FIG. 3 illustrates a side view of the current monitoring apparatus 100 in accordance with some implementations of the current subject matter. In one implementation, diameter of the current monitor 104 can have a same order as the order of width of the plugs 102 and 108, and can have a same order as the order of width of current monitor 104. Thus, the current monitor 104 may not be extremely large, but instead can be compact. Therefore, the addition of the current monitoring apparatus 100 does not add significant weight or space to the cord and plug 108 of the electrical equipment. Moreover, the current monitoring apparatus 100 can occupy minimal space, and can be placed in small/tight places as well. Further, the current monitoring apparatus 100 can be packaged firmly and compactly. Such firm packaging can prevent the electrical/electronic circuitry components being exposed to undesired environment/conditions. Further, the packaging can allow the current monitoring apparatus 100 to be conveniently moved as a single entity.

Figure 4:
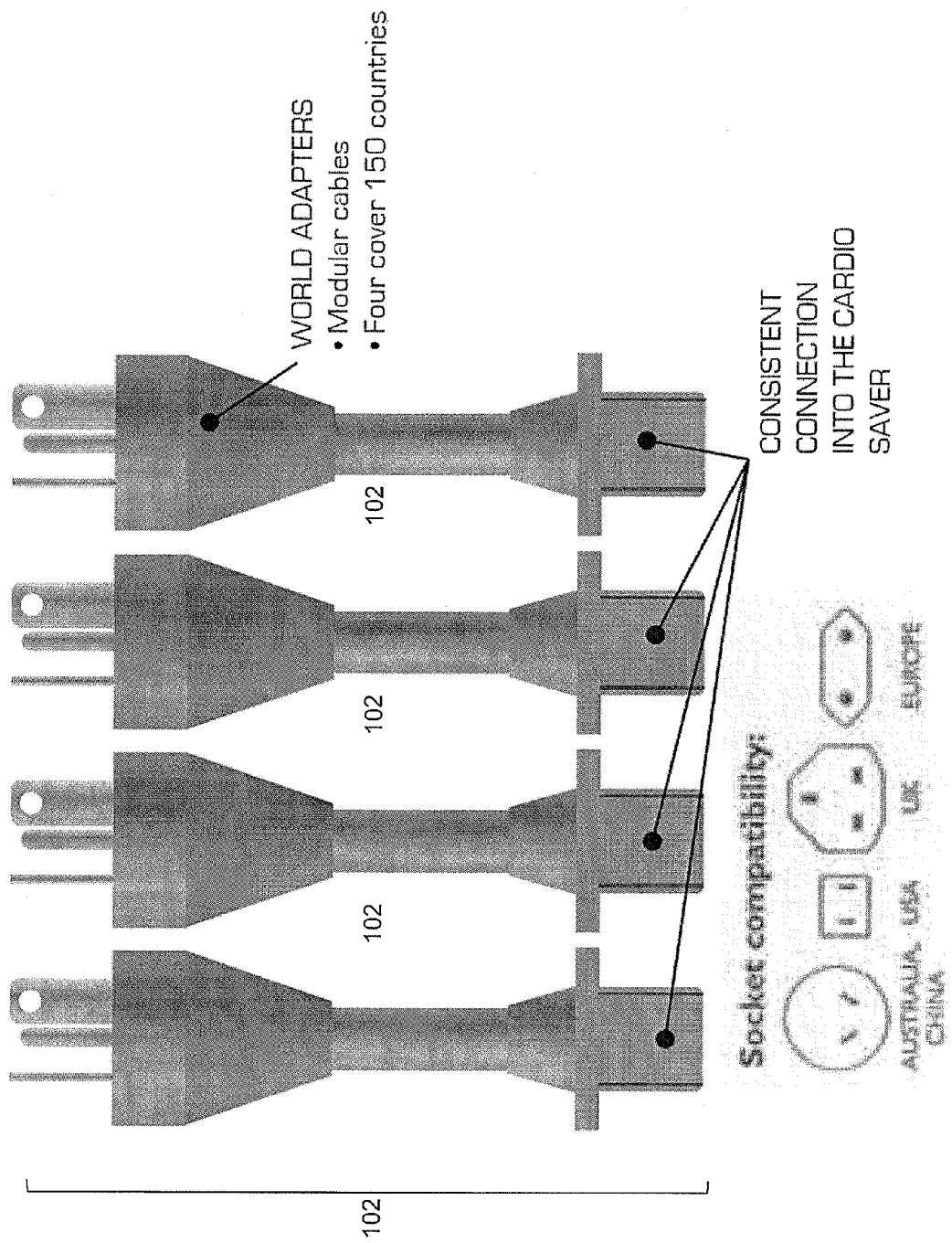
FIG. 4 illustrates multiple current monitoring apparatuses being used in parallel for a plurality of electrical equipments that can function in parallel, such as treadmills.

FIG. 4 illustrates multiple current monitoring apparatuses 100 being used in parallel for a plurality of electrical equipments that can function in parallel. Further, FIG. 4 shows that each connector 102 can be separable from corresponding current monitors 104. The connector (e.g. plug or adapter) 102 can be compatible for different female sockets used across different countries/continents, which include Australia, China, United Kingdom, Europe and others. For example, four different versions of connectors 102 can be used to cover at least 150 different countries. A common control monitor 104 can be connected to each different connector 102.

Figure 5:
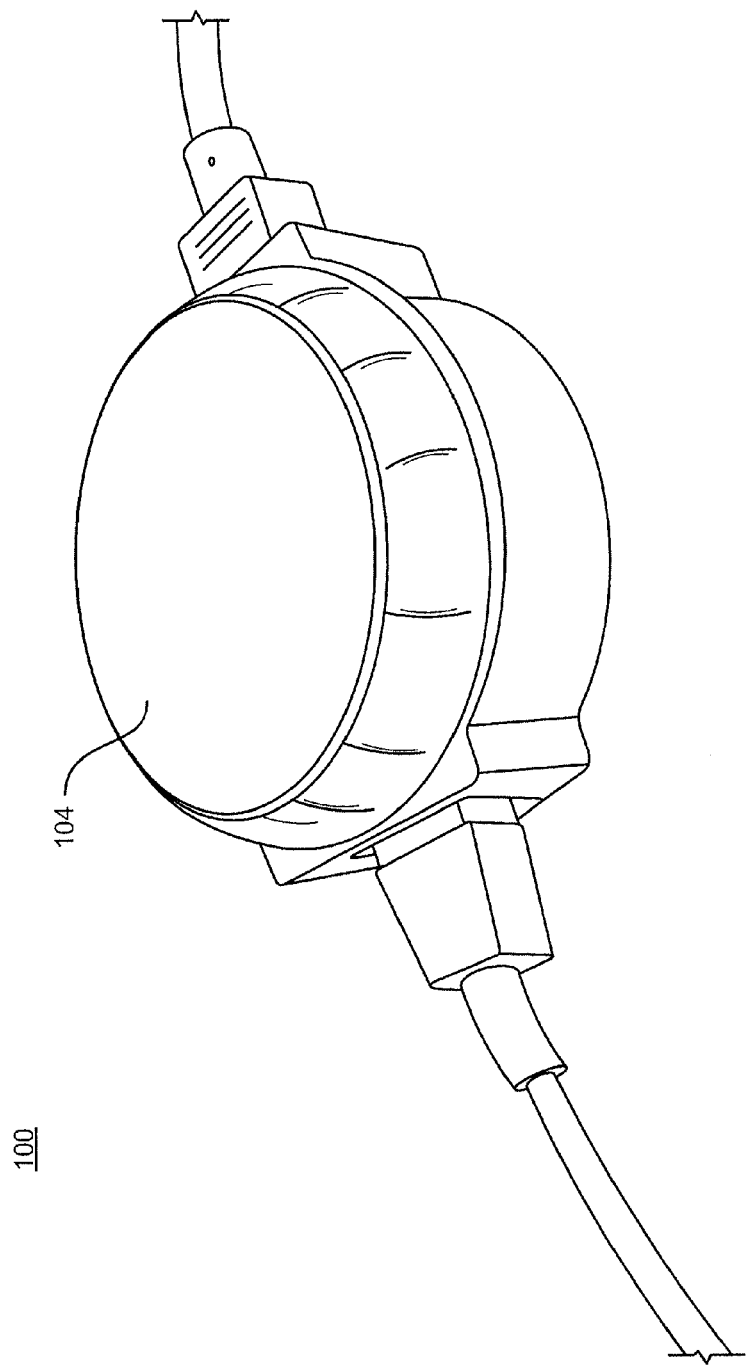
FIG. 5 illustrates a perspective view of a connected current monitoring apparatus in accordance with some implementations of the current subject matter.

FIG. 5 illustrates a perspective view of a connected current monitoring apparatus 100 in accordance with some implementations of the current subject matter.

Figure 6:
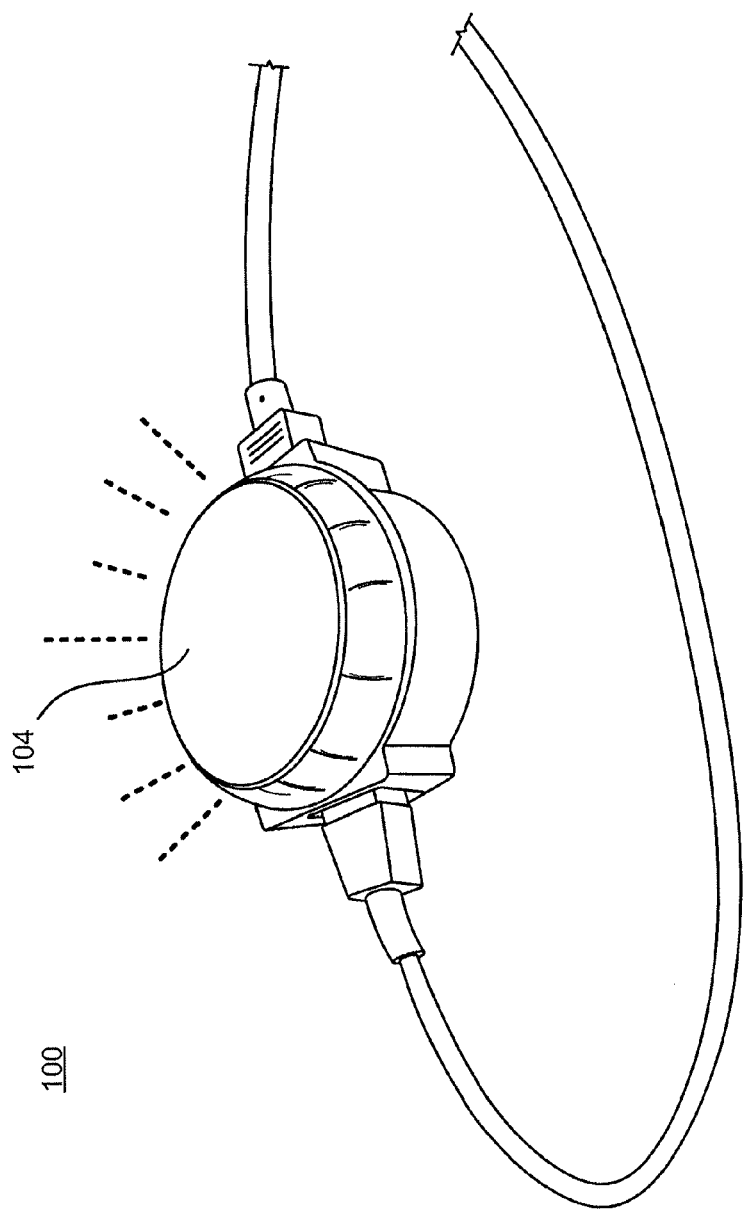
FIG. 6 illustrates a perspective view of a connected current monitoring apparatus in accordance with some implementations of the current subject matter.

FIG. 6 illustrates a perspective view of a connected current monitoring apparatus 100 in accordance with some implementations of the current subject matter.

Figure 7:
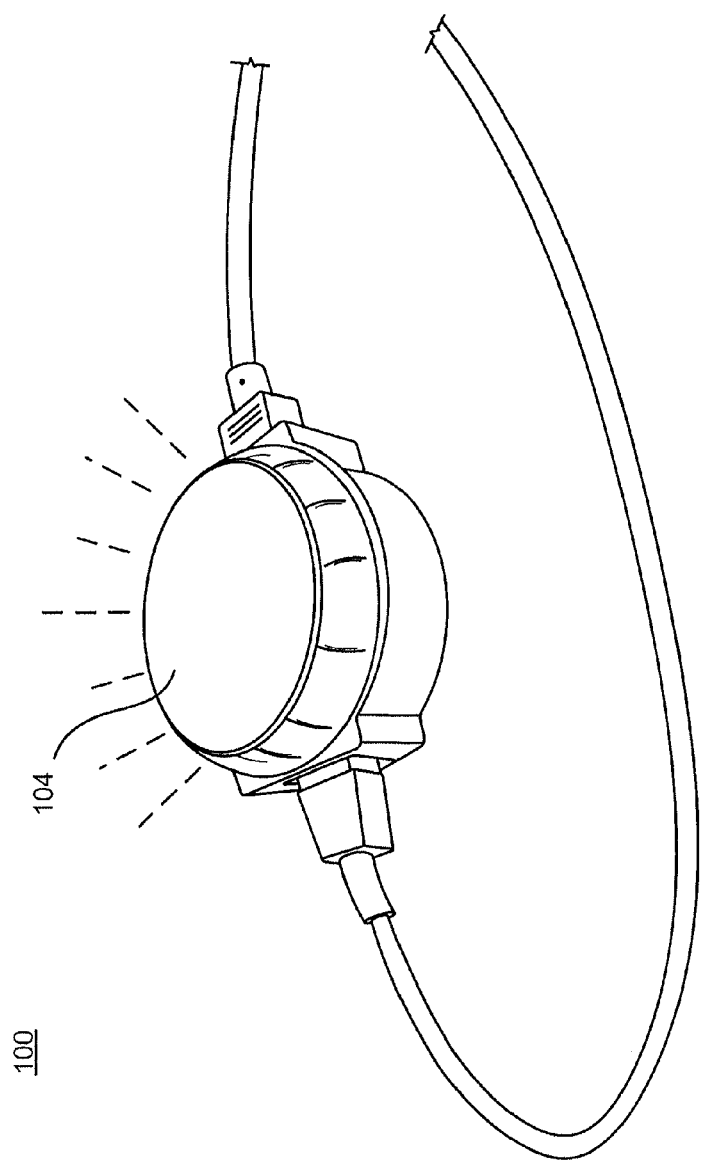
FIG. 7 illustrates a perspective view of a connected current monitoring apparatus in accordance with some implementations of the current subject matter.

FIG. 7 illustrates a perspective view of a connected current monitoring apparatus 100 in accordance with some implementations of the current subject matter.

Figure 8:
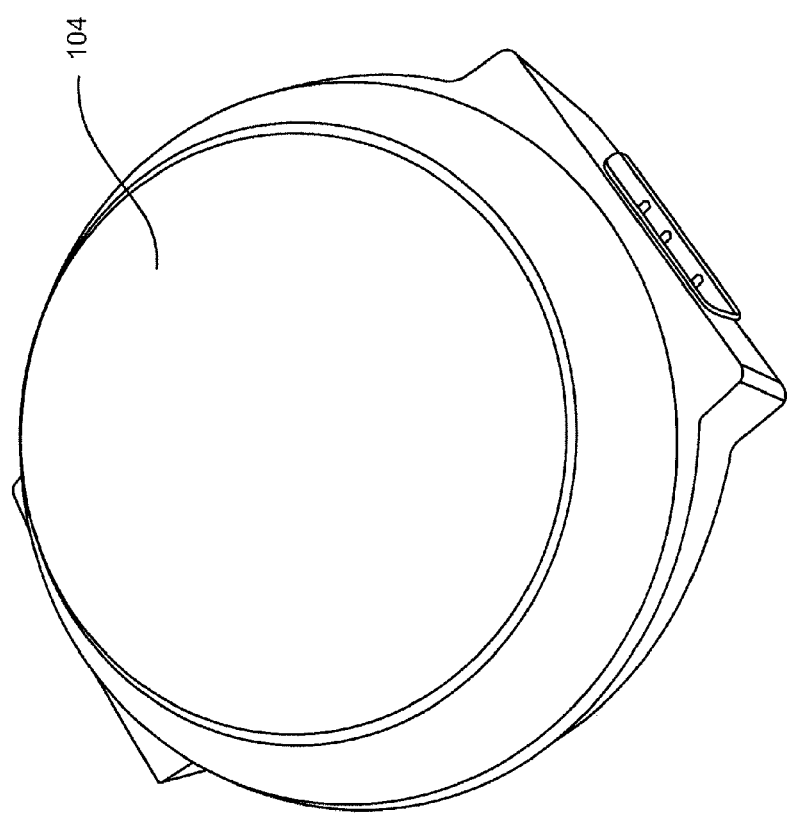
FIG. 8 illustrates a perspective view of a current monitor in accordance with some implementations of the current subject matter.

FIG. 8 illustrates a perspective view of a current monitor 104 in accordance with some implementations of the current subject matter.

Figure 9:
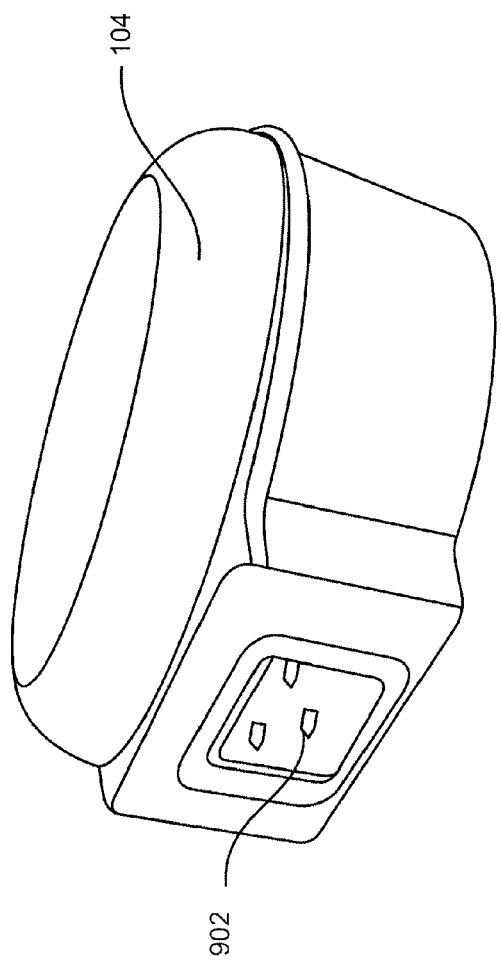
FIG. 9 illustrates a perspective view of a current monitor in accordance with some implementations of the current subject matter.

FIG. 9 illustrates a perspective view of a current monitor 104 in accordance with some implementations of the current subject matter. The current monitor 104 can include a male port 902 that connects with a female port of connector 102.

Figure 10:
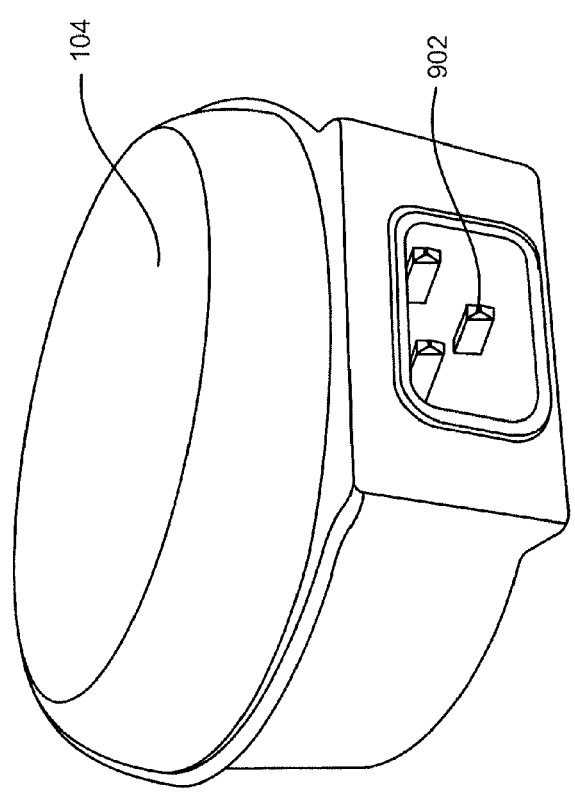
FIG. 10 illustrates a perspective view of a current monitor in accordance with some implementations of the current subject matter.

FIG. 10 illustrates a perspective view of a current monitor 104 in accordance with some implementations of the current subject matter.

Figure 11:
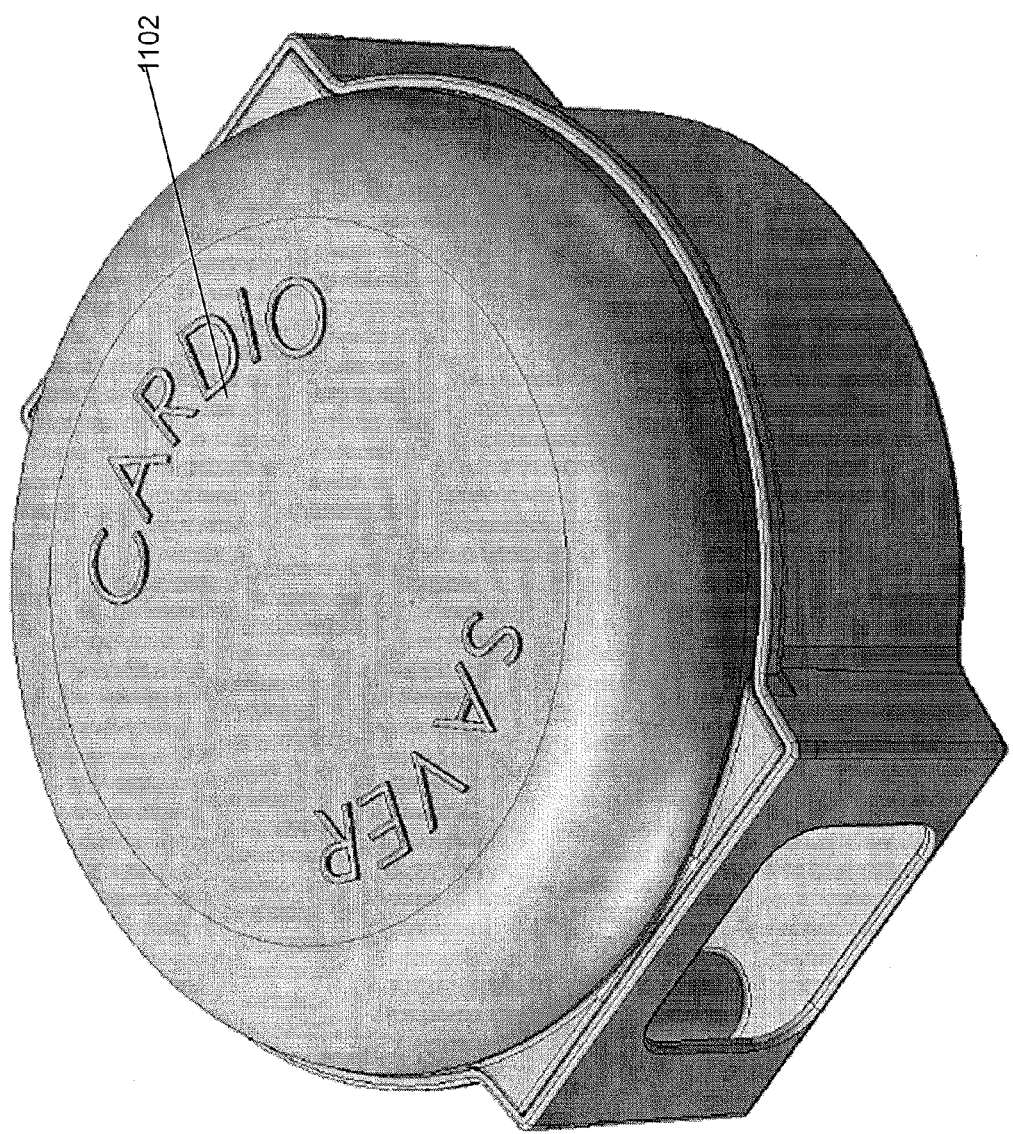
FIG. 11 illustrates a top perspective view of packaging of a current monitor in accordance with some implementations of the current subject matter.

FIG. 11 illustrates a top perspective view of packaging 1102 of a current monitor 104 in accordance with some implementations of the current subject matter. Although the current monitor 104 has been described as a circular, a skilled artisan understands that the current monitor 104 can have other shapes, such as shapes of a square, rectangle, triangle, trapezoid, polygon, and the like. Such a flexibility of shapes can allow the current monitor 104 to be packaged according to specific requirement of a customer (e.g. gym).

Figure 12:
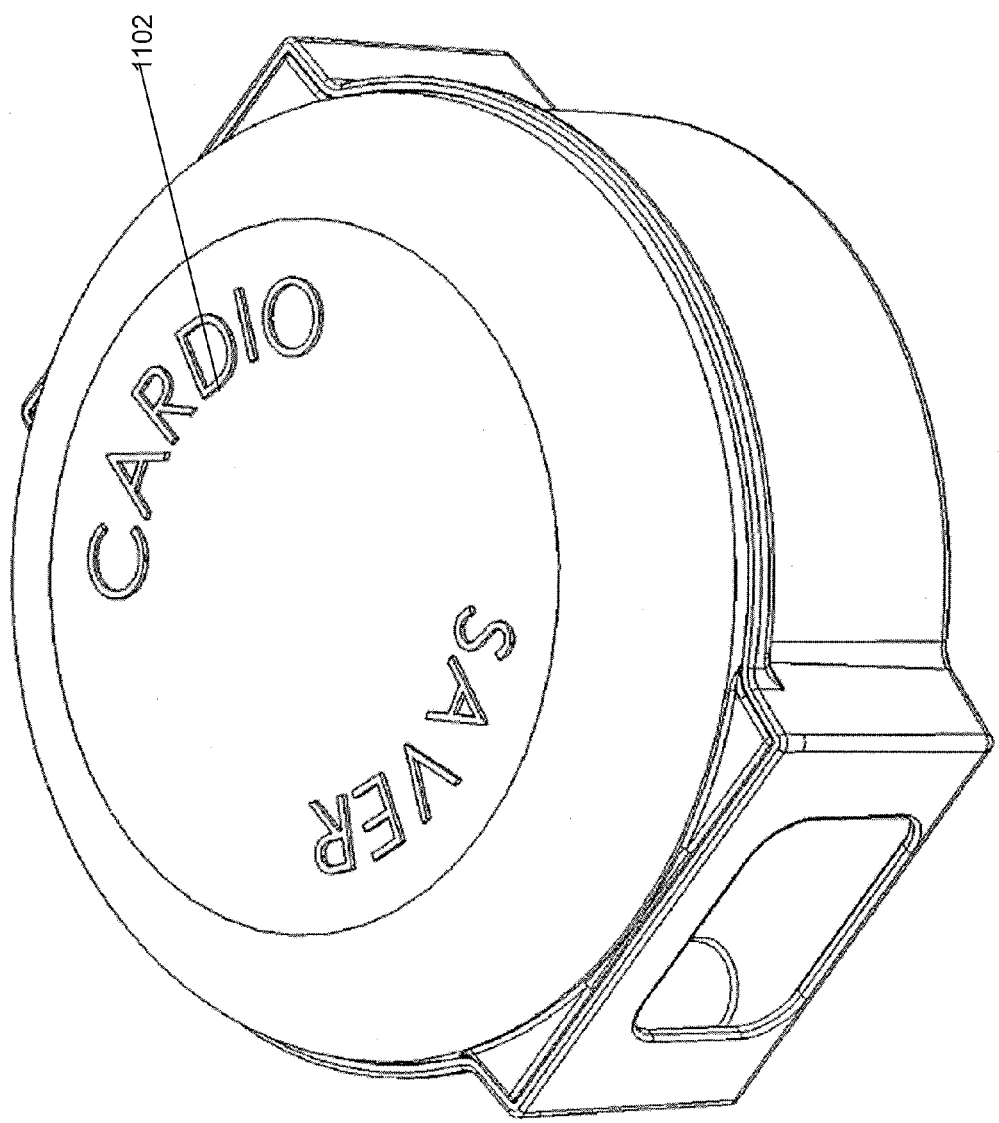
FIG. 12 illustrates a top perspective view of packaging of a current monitor in accordance with some implementations of the current subject matter.

FIG. 12 illustrates a top perspective view of packaging 1102 of a current monitor 104 in accordance with some implementations of the current subject matter.

Figure 13:
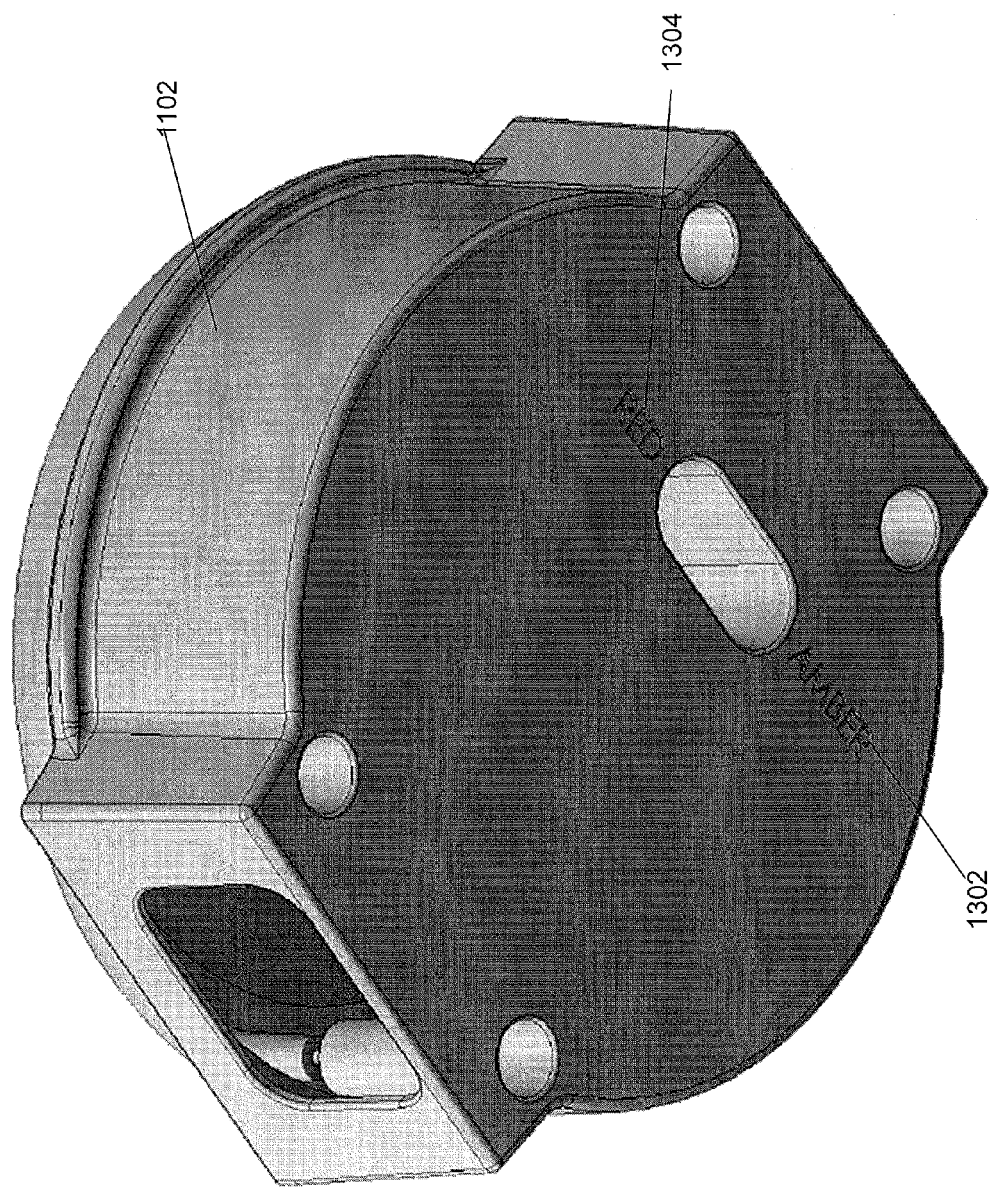
FIG. 13 illustrates a bottom perspective view of packaging of a current monitor in accordance with some implementations of the current subject matter.

FIG. 13 illustrates a bottom perspective view of packaging 1102 of a current monitor 104 in accordance with some implementations of the current subject matter. The bottom perspective view of the packaging can include an area 1302 that can indicate "AMBER," such that the amber/yellow set point control 204 can be located under the area 1302 on the packaging 1102. The bottom perspective view of the packaging 1102 can include an area 1304 that can indicate "RED," such that the red set point control 206 can be located under the area 1304.

Figure 14:
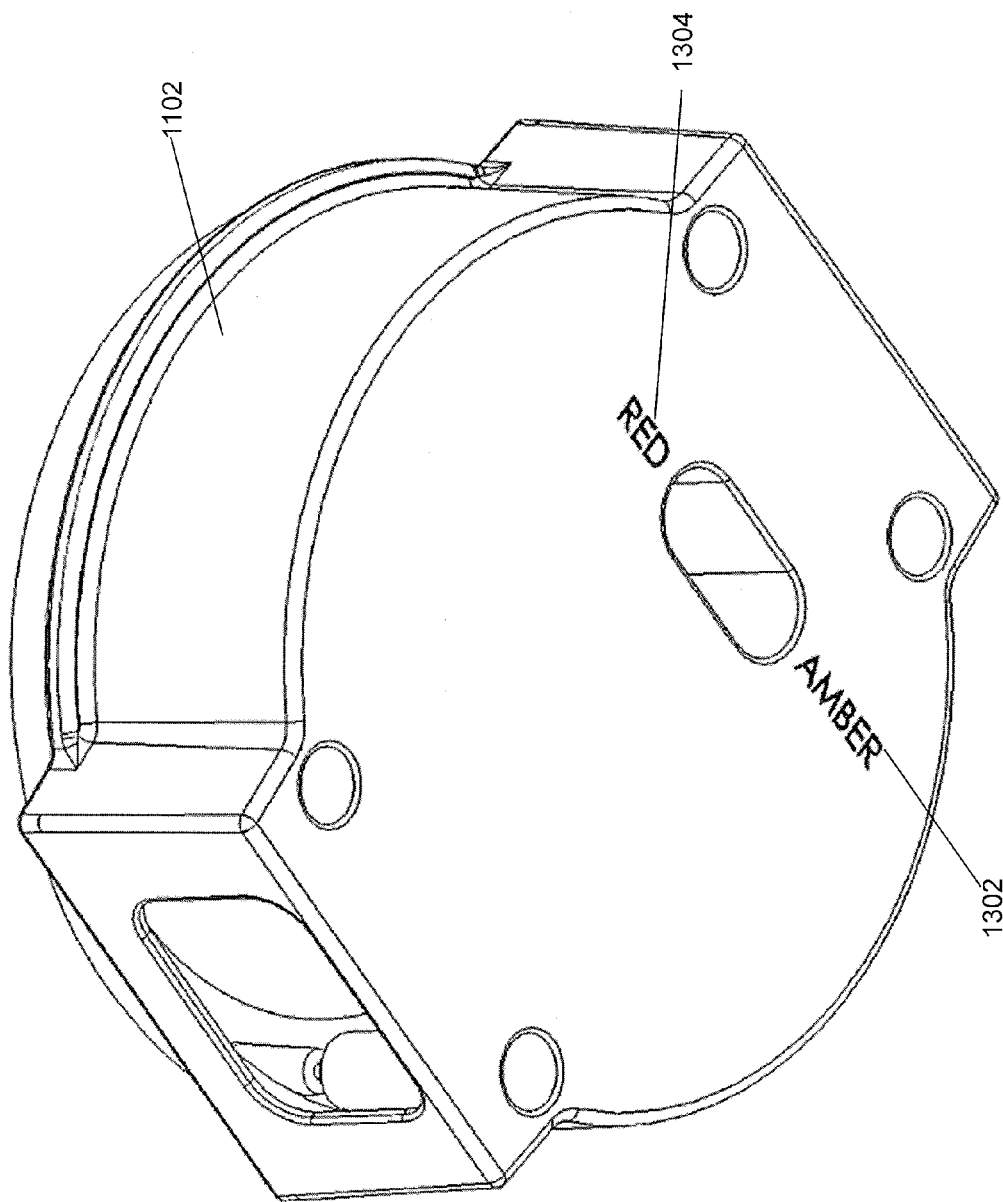
FIG. 14 illustrates a bottom perspective view of packaging of a current monitor in accordance with some implementations of the current subject matter.

FIG. 14 illustrates a bottom perspective view of packaging 1102 of a current monitor 104 in accordance with some implementations of the current subject matter.

Figure 15:
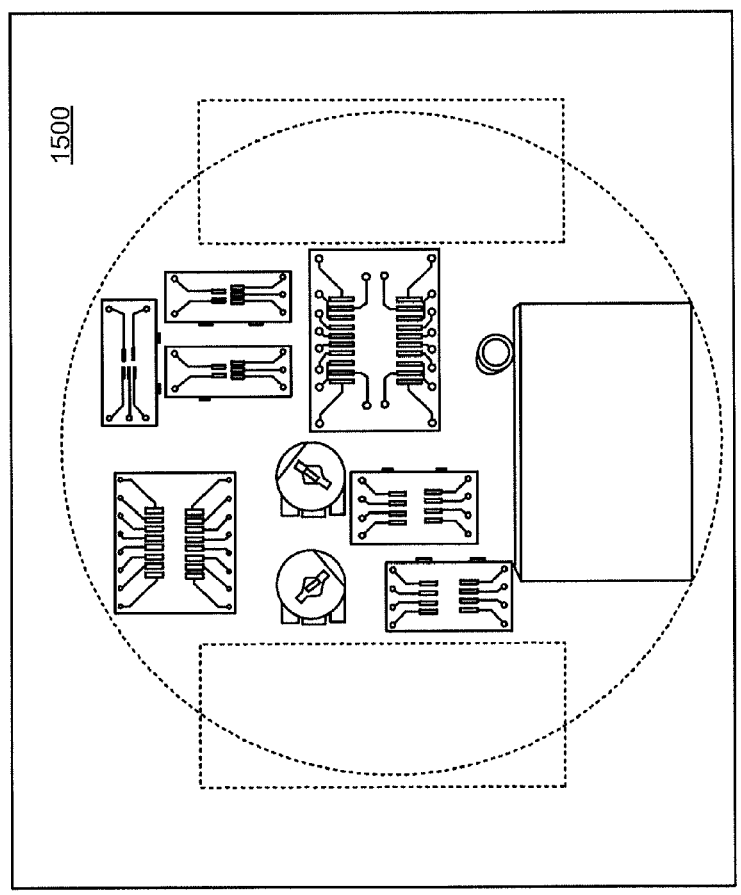
FIG. 15 illustrates a circuit board, on which electrical/electronic elements are embedded as per an electrical/electronic circuit in accordance with some implementations of the current subject matter.

FIG. 15 illustrates a circuit board 1500, on which electrical/electronic elements are embedded as per an electrical/electronic circuit in accordance with some implementations of the current subject matter.

Figure 16:
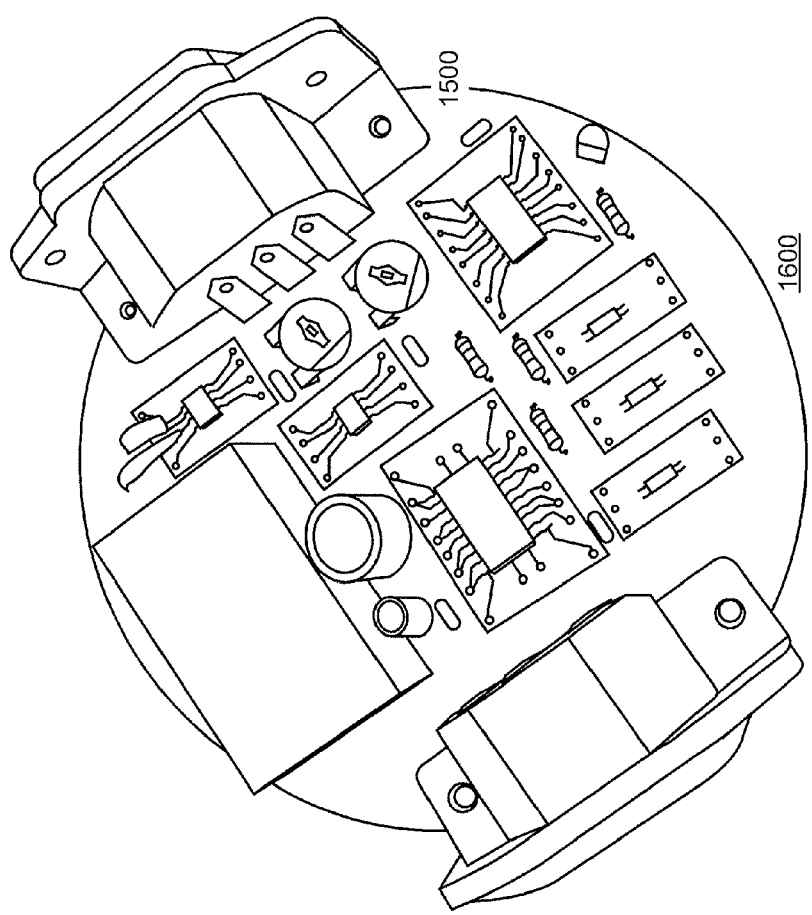
FIG. 16 illustrates a top perspective view of a circuit board, on which electrical/electronic elements are connected together as per an electrical/electronic circuit in accordance with some implementations of the current subject matter.

FIG. 16 illustrates a top perspective view of a circuit board 1500, on which electrical/electronic elements are connected together as per electrical/electronic circuit 1600 in accordance with some implementations of the current subject matter.

Figure 17:
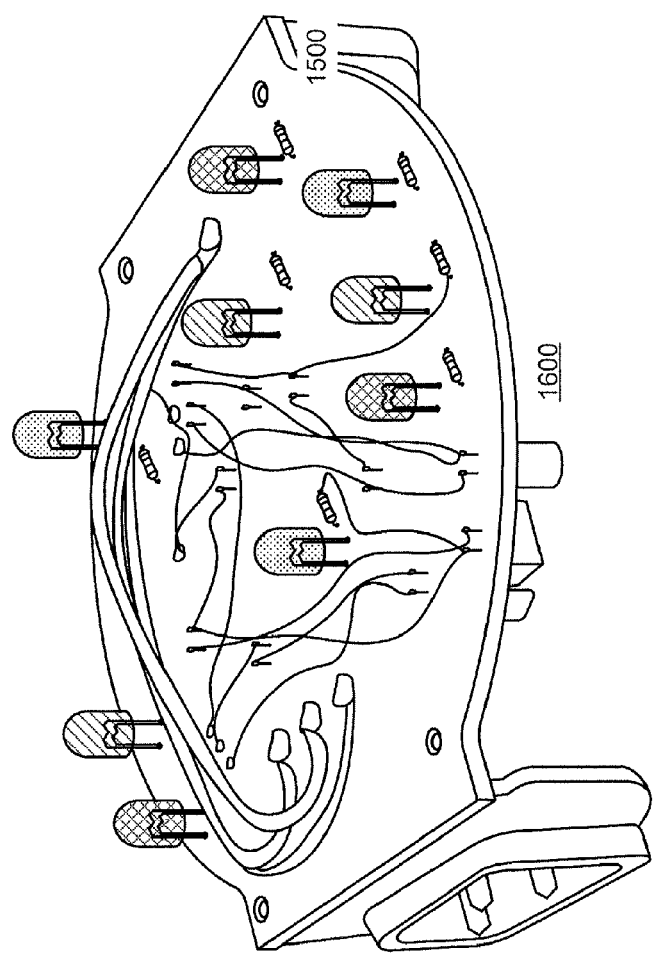
FIG. 17 illustrates a bottom perspective view of the circuit board, on which electrical/electronic elements are connected together as per an electrical/electronic circuit in accordance with some implementations of the current subject matter.

FIG. 17 illustrates a bottom perspective view of the circuit board 1500, on which electrical/electronic elements are connected together as per electrical/electronic circuit 1600 in accordance with some implementations of the current subject matter. The bottom perspective view shows the connections between various points on electrical/electronic elements of the electrical/electronic circuit 1600. Such connections can be made by at least one of soldering, intertwining, locking, taping, screwing, and like mechanisms.

Figure 18:
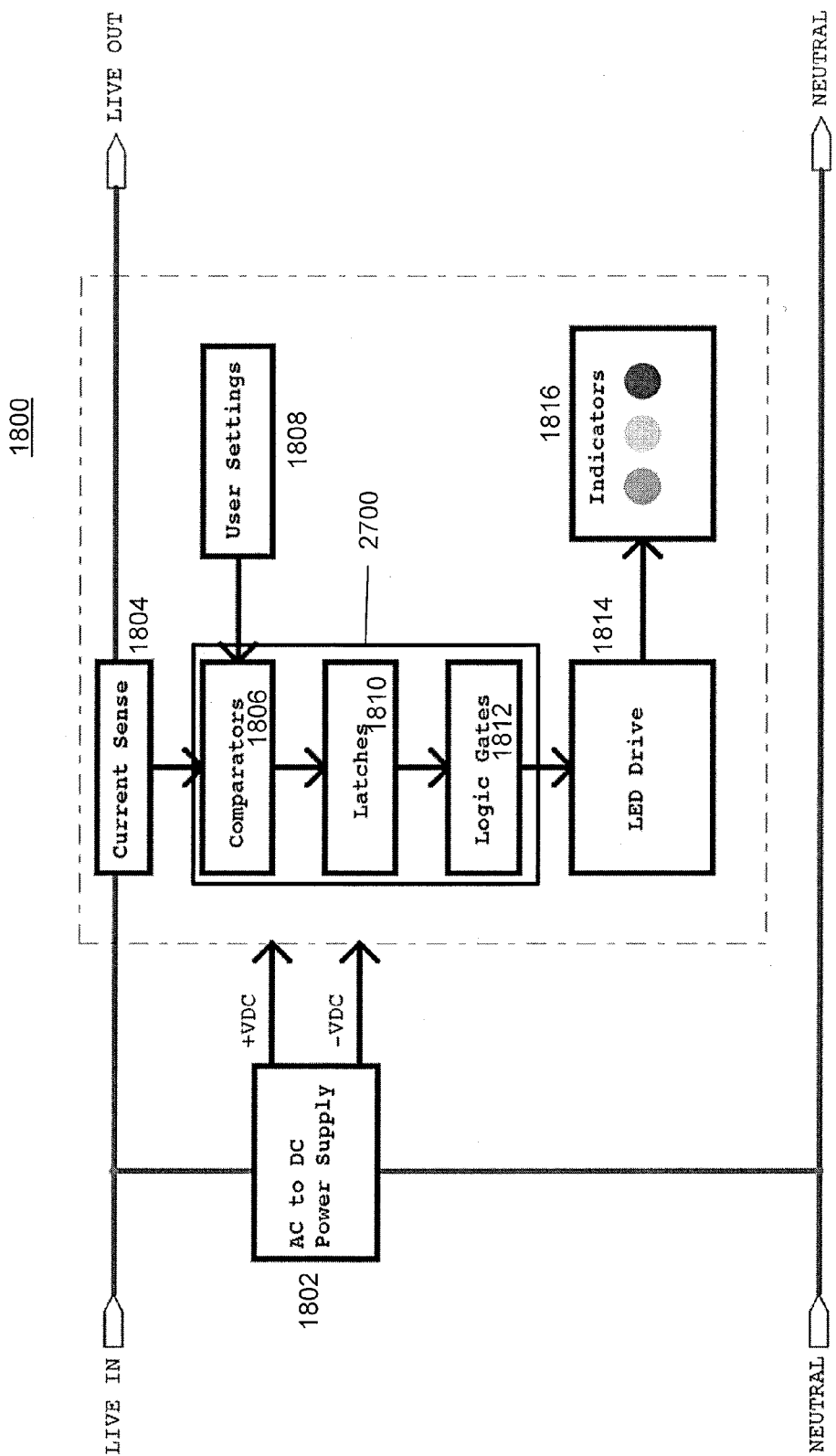
FIG. 18 illustrates a block diagram characterizing/representing the electrical/electronic circuit in accordance with some implementations of the current subject matter.

FIG. 18 illustrates a block diagram 1800 characterizing/representing the electrical/electronic circuit 1600 in accordance with some implementations of the current subject matter. The block diagram can include an alternating current (AC) to direct current (DC) circuit 1802, current sense 1804, comparators 1806, user settings 1808, latches 1810, logic gates 1812, LED drive 1814, and LED indicators 1816. The LED drive 1814 can include switches used to turn on and off the LEDs. Herein, the term LED indicator(s) is used interchangeably with the LED(s).

The AC to DC circuit 1802 can convert alternating current withdrawn by the current monitoring apparatus 100 from a power source.

The current sense 1804 can be a bi-directional current sensor. The bi-directional current sensor can sense/measure the drawn current in the direction of the drawn current.

The comparators 1806 can compare input current (i.e. current withdrawn by electrical equipment) with one or more thresholds (i.e., a value of current where the currently-activated one or more LEDs of a particular color are deactivated and LEDs of another color are activated; there can be multiple thresholds corresponding to respective colors of LEDs) to determine which color LEDs can be activated.

The user settings 1808 can allow a user to adjust the above-mentioned one or more thresholds. For example, FIG. 2 shows that a user can set an amber/yellow set point using amber/yellow set point control 204 and can set a red set point using a red set point control 206.

The latches 1810 can store data, which can be a system-state that characterizes a unique configuration of information in a program or a machine. For example, the latches 1810 can enable the color of the activated one or more LEDs to be retained even after a user of the electrical equipment stops using the electrical equipment. One or more values (e.g. color) stored by the latches 1810 can be reset by unplugging/disconnecting the current monitoring apparatus 100 from the power source. There can be a power on reset that can be used to reset the latches. This can allow the color of the LED to be maintained/retained even after the electrical equipment is no longer being used (e.g., a user stops using the treadmill). This can allow the color to be shown even when the user is no longer using the electrical equipment. This display of the retained color even when the user is no longer using the electrical equipment can be advantageous, as a user of the electrical equipment is informed about the condition of the electrical equipment even when the electrical equipment is not being used. Otherwise, when retained color is not displayed when the electrical is not functioning, a user may have to at least use the electrical equipment to roughly/inaccurately gauge the condition of the electrical equipment, and only a technician can gauge a more accurate condition. Thus, it is advantageous to know condition of the electrical equipment irrespective of whether the electrical equipment is being used.

In some aspects, a reuse of the electrical equipment may not allow a change of the retained color to a color associated with a lower range of current. For example, if amber/yellow color is retained, the amber/yellow color may not change to green after a later reuse of the electrical equipment until the latching mechanism is reset. That is, if LEDs of amber/yellow color are activated, previously deactivated LEDs of green color may not be reactivated until the latching mechanism is reset. The latching mechanism may be recommended to be reset when the electrical equipment is lubricated. However, by reuse of the electrical equipment, the retained color can be changed to a color (e.g. red) associated with a higher range of current.

The logic gates 1812 can perform logic operations associated with electrical/electronic circuit 1600. Each logic gate 1812 can receive one or more inputs, and in response, can produce one or more logical outputs. The LED drive 1814 can include switches used to turn on and off the LEDs 1816. Herein, the term LED indicator(s) is used interchangeably with the LED(s).

Figure 19:
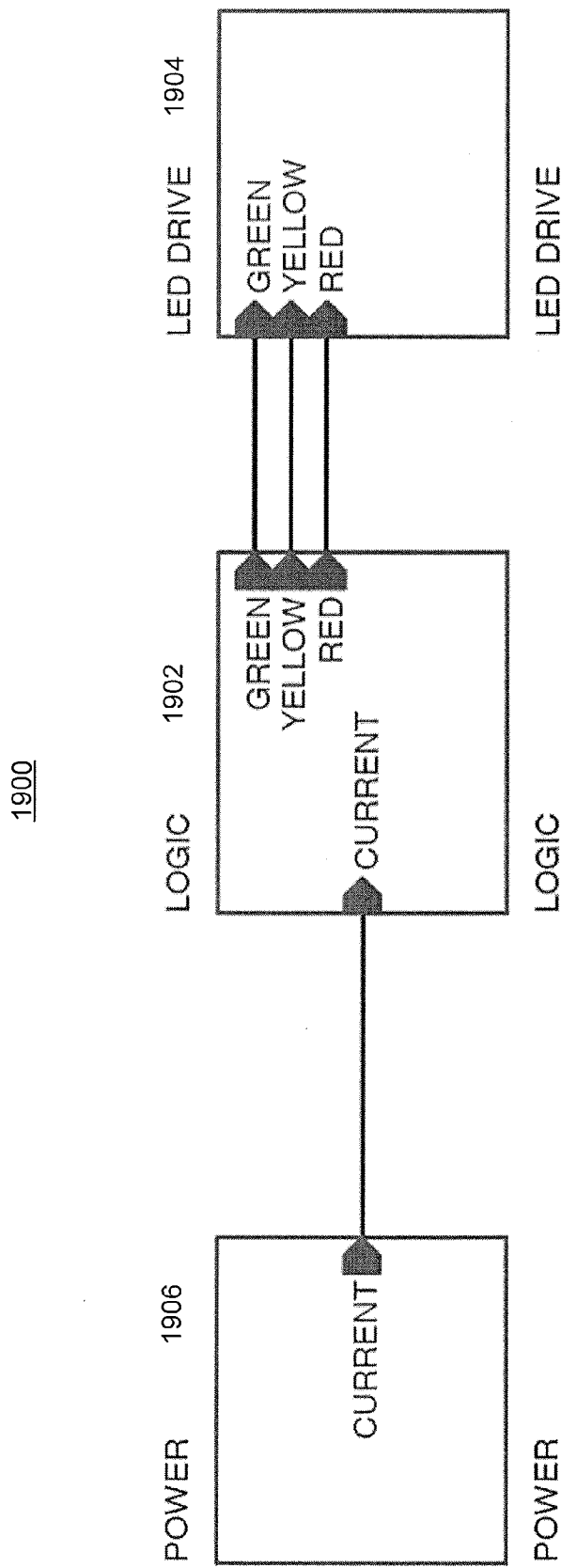
FIG. 19 illustrates box diagram illustrating aspects of a system in accordance with some implementations of the current subject matter.

FIG. 19 illustrates a box diagram 1900 illustrating aspects of a system in accordance with some implementations of the current subject matter. The logic block 1902 can characterize logic implemented by the electrical/electronic circuit 1600 that can withdraw, based on current requirement by the electrical equipment, current from power source characterized by power block 1906. Based on the logic, the same colored LEDs (i.e. one of green, amber/yellow, and red LEDs) of the plurality of LEDs (i.e. green, amber/yellow, and red LEDs) can be activated. These LEDs can be included in the LED drive block 1904.

Figure 20:
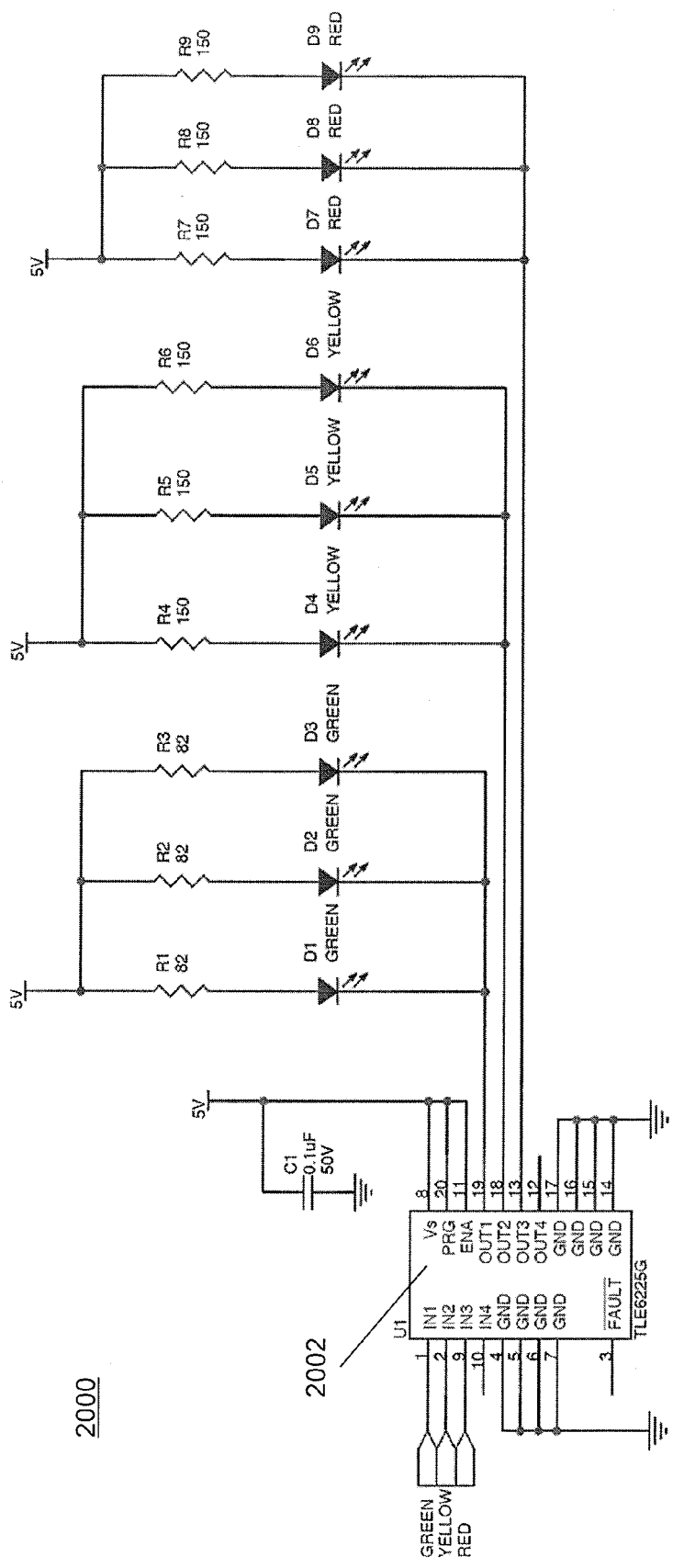
FIG. 20 illustrates electrical/electronic circuit for the LED drive block shown in FIG. 19 in accordance with some implementations of the current subject matter.

FIG. 20 illustrates an electrical/electronic circuit 2000 for the LED drive block 1904 shown in FIG. 19 in accordance with some implementations of the current subject matter. The LED drive block 1904 can comprise an integrated circuit chip 2002, an example of which can be TLE6225G by Infineon Technologies. The integrated circuit 2002 chip can be an automotive integrated circuit, which can comprise integrated multichannel switches that can control small loads, such as LEDs D1, D2, D3, D4, D5, D6, D7, D8, and D9. The integrated circuit chip 2002 can have a serial peripheral interface, thereby reducing the number of microcontroller inputs and outputs. Therefore, integrated circuit chip 2002 may require microcontroller pins and external components that are fewer than microcontroller pins and external components required by conventional integrated circuit chips. The integrated circuit chip 2002 can prevent the associated electrical/electronic circuit from failing due to a short circuit or overloading. Further, the integrated circuit chip 2002 can implement a "limp home function," where functionality of the associated electrical/electronic circuit can be maintained even with a missing digital supply.

Figure 21:
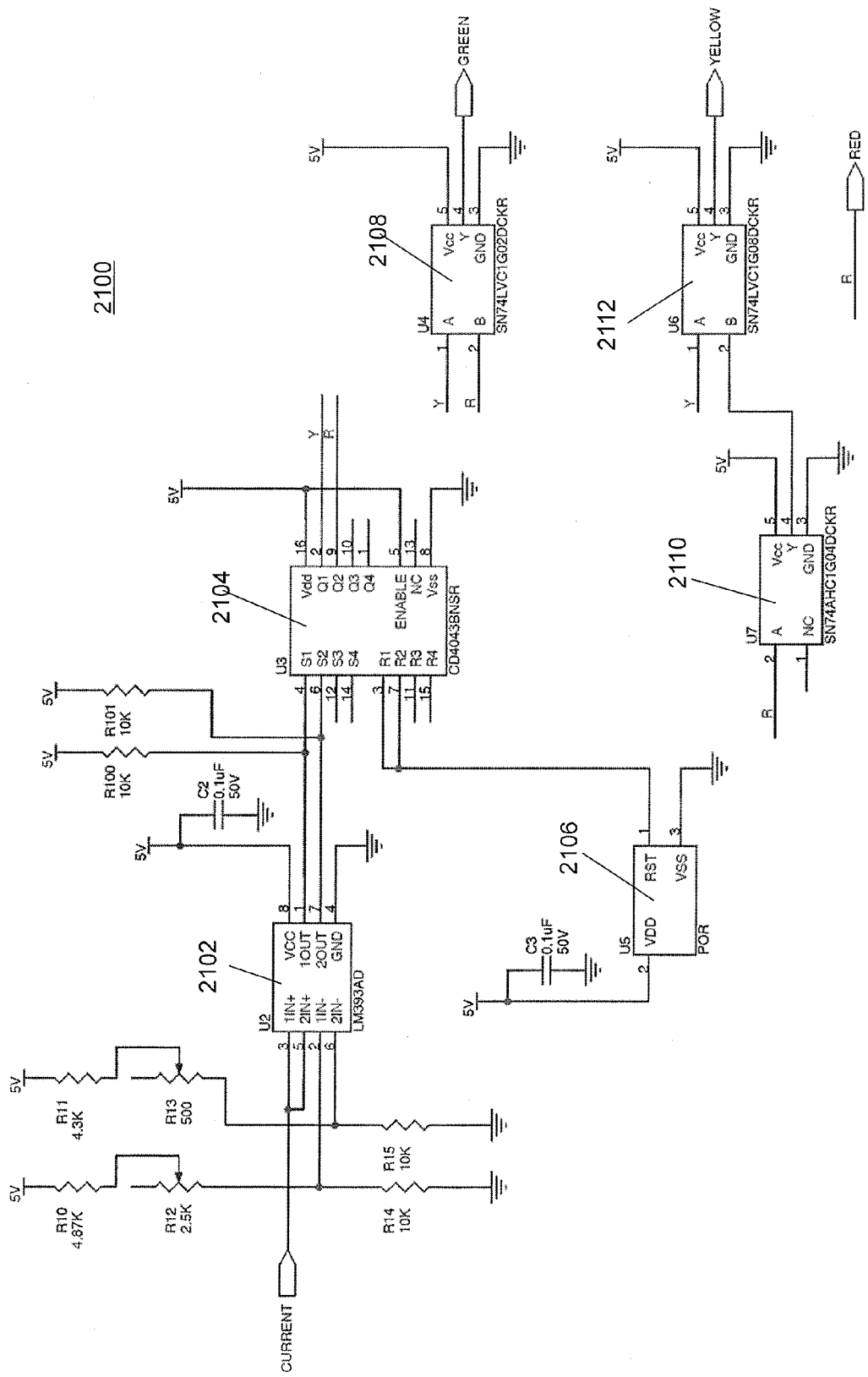
FIG. 21 illustrates electrical/electronic circuit for the logic block shown in FIG. 19 in accordance with some implementations of the current subject matter.

FIG. 21 illustrates electrical/electronic circuit 2100 for the logic block 1902 shown in FIG. 19 in accordance with some implementations of the current subject matter. The logic block 1902 can include multiple integrated circuits including: (1) an integrated circuit 2102 characterizing a dual differential comparator 2102, an example of which can be LM393AD, (2) an integrated circuit 2104 characterizing a complementary metal-oxide semiconductor (CMOS) quad NOR latch 2104 with three inputs, an example of which can be CD4043BNSR, (3) an integrated circuit 2106 characterizing a power on reset integrated circuit 2106, an example of which can be POR, (4) an integrated circuit 2108 characterizing a single 2-input positive-NOR gate 2108, an example of which can be SN74LVC1G02DCKR, (5) an integrated circuit 1910 characterizing a single inverter gate 2110, an example of which can be SN74AHC1G04DCKR, and (6) an integrated circuit 2112 characterizing a single 2-input positive-AND gate 2112, an example of which can be SN74LVC1G08DCKR.

Figure 22:
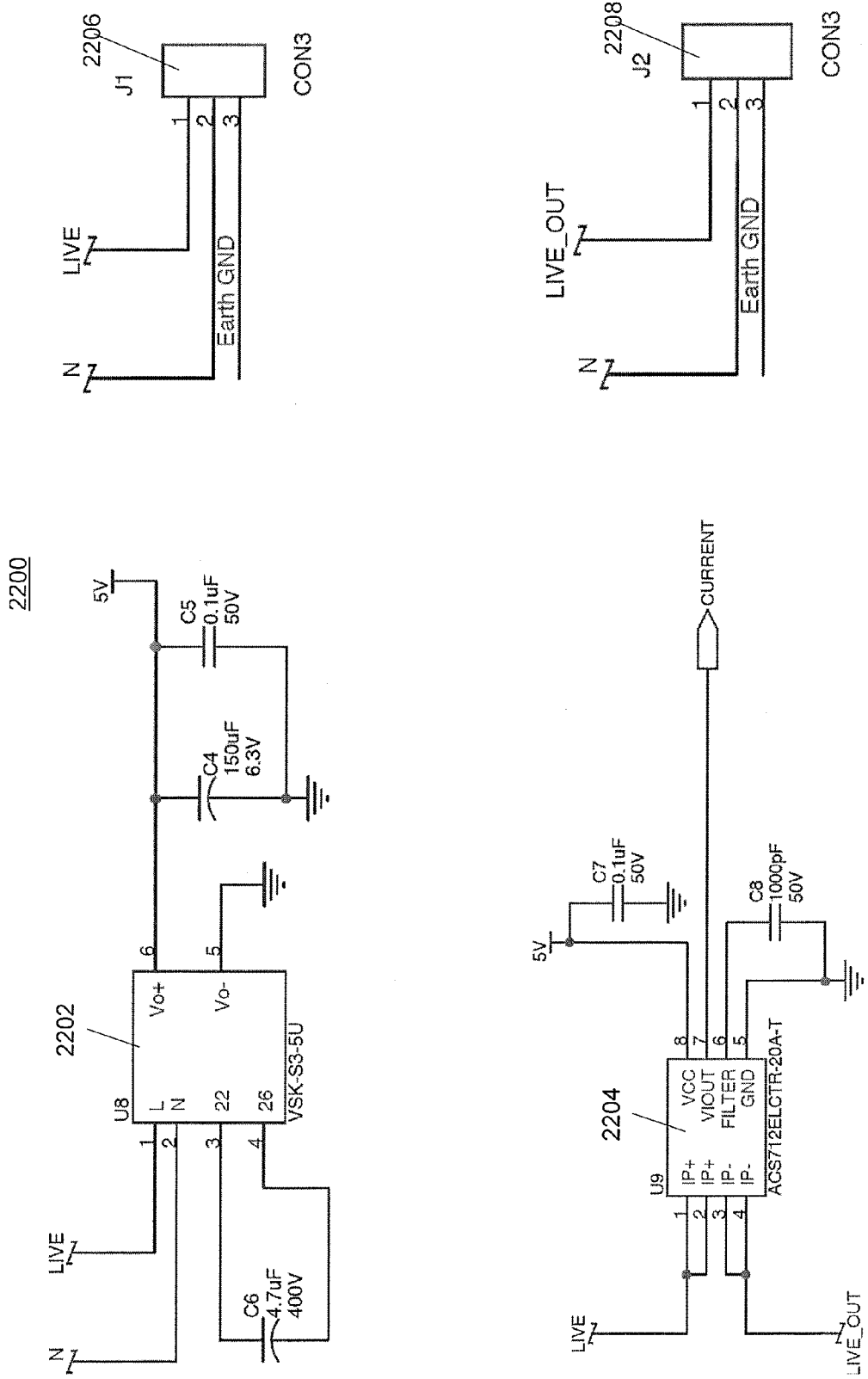
FIG. 22 illustrates electrical/electronic circuit for the power block shown in FIG. 19 in accordance with some implementations of the current subject matter.

FIG. 22 illustrates an electrical/electronic circuit 2200 for the power block 1906 shown in FIG. 19 in accordance with some implementations of the current subject matter. The power block 1906 can include: (1) an alternating current (AC) to direct current (DC) converter 2202, (2) an integrated circuit 2204 characterizing a bi-directional current sensor, an example of which can be ACS712ELCTR-20A-T, (3) a J1 connector 2206, and (4) a J2 connector 2208. The AC to DC converter 2202 converts the alternating current withdrawn by the electrical equipment to direct current.

Figure 23:
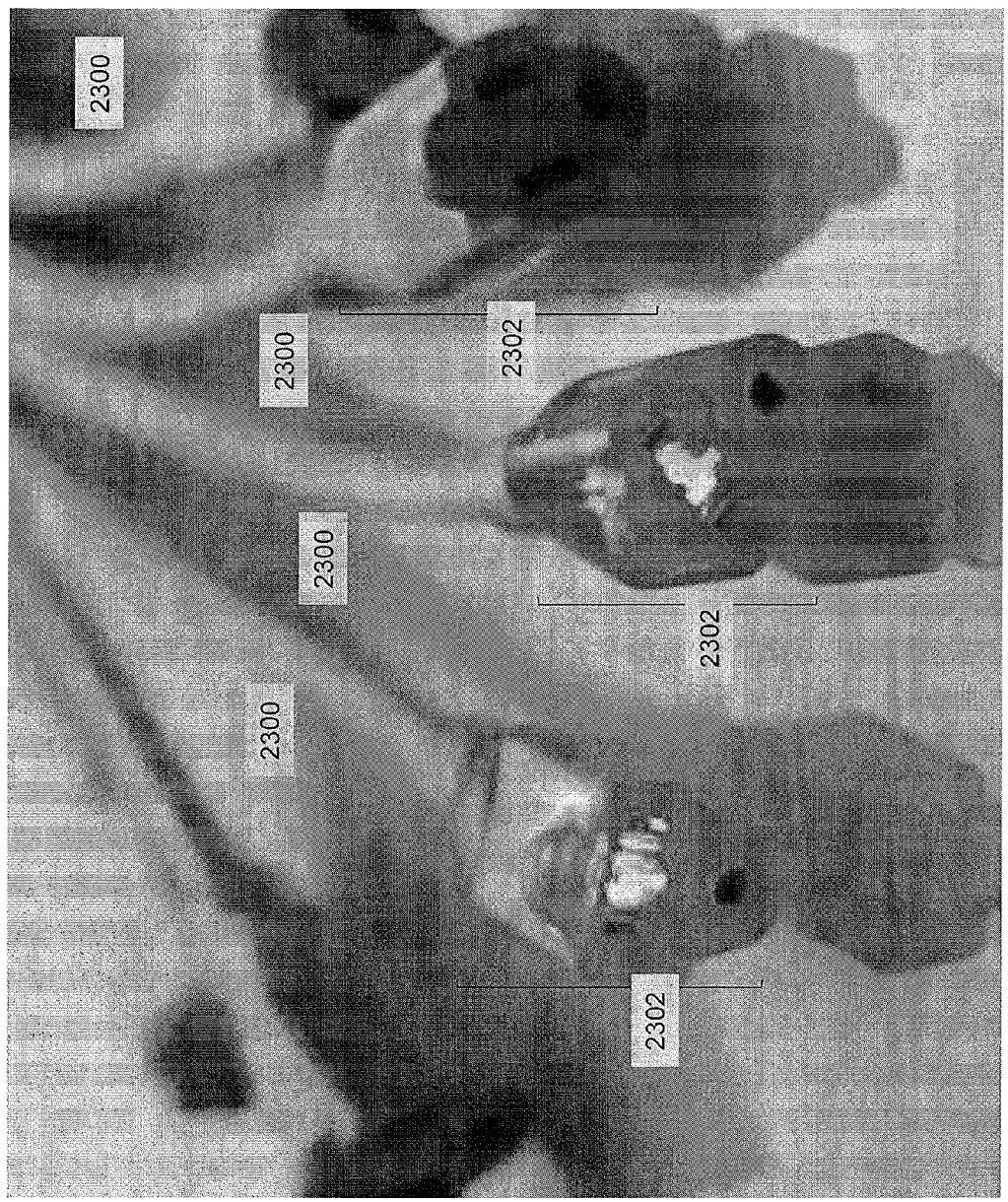
FIG. 23 illustrates current monitoring apparatus, which is a variation of current monitoring shown at least in FIGS. 1-3, in accordance with some implementations of the current subject matter.

FIG. 23 illustrates current monitoring apparatus 2300, which is a variation of current monitoring apparatus 100 shown at least in FIGS. 1-3, in accordance with some implementations of the current subject matter. The current monitoring electrical/electronic circuit associated with the current monitoring apparatus 2300 can be embedded in unit 2302. The current monitoring apparatus 2300 can be connected to electrical equipment. The activation of one or more LEDs of a particular color can inform a user of the electrical equipment about the condition of the electrical equipment, thereby indicating whether and when lubrication of the electrical equipment is required, wherein the LEDs can be implemented in the current monitoring electrical/electronic circuit.

Figure 24:
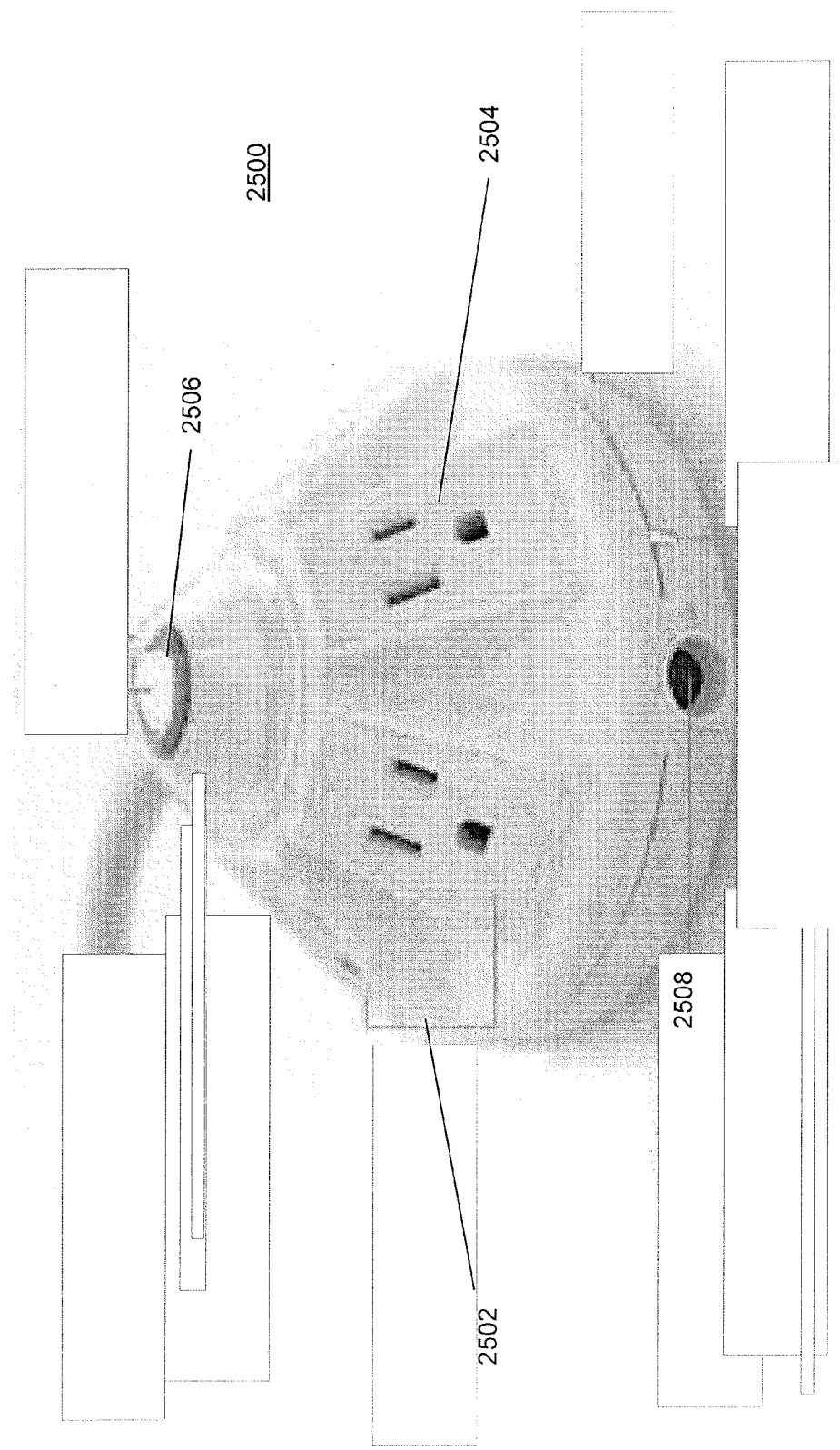
FIG. 24 illustrates another variation of current monitoring apparatus in accordance with some implementations of the current subject matter.

FIG. 24 illustrates another variation of current monitoring apparatus in accordance with some implementations of the current subject matter. The current monitoring apparatus 2500 can obtain input current from an alternating current power source. The current monitoring apparatus 2500 can include a plurality of female ports 2502, 2504. Thus, multiple electrical equipments, such as treadmills, can be connected to the current monitoring apparatus 2500 via the female ports 2502, 2504. The current monitoring apparatus 2500 can include an electrical/electronic circuit to perform monitoring and displaying of the condition of the electrical equipment using LEDs of corresponding colors, as noted above. A circular display tube 2506 can include the LEDs, and accordingly, the color displayed by the circular display tube 2506 can indicate the color of the LEDs that get activated. The red-colored glowing (caused by activation of one or more LEDs of red color), as noted above, of the circular display tube 2506 can indicate a critical condition associated with at least one of the attached electrical equipments and that at least one of the attached electrical equipments may need lubrication. Further, the current monitoring apparatus 2500 can include a circuit breaker 2508.

In another variation, the circular display tube 2506 can be divided into different sections, such that each section can correspond to the respective female connector (one of 2502 and 2504) that is below this section. In this variation, each section of the circular display tube 2506 can display different colors, thereby indicating separate conditions and lubrication/maintenance-requirements for corresponding electrical equipment connected to corresponding female connector (one of 2502 and 2504).

Although LEDs have been described for a convenient display of range in which withdrawn current lies, other display technologies can also be used, such as text and/or graphical output on a user interface, laser diode technology, nixie tube technology, cathode ray tube technology, plasma display technology, liquid crystal display (LCD) technology, electronic paper technology, electroluminescent display technology, and the like. Such display technologies can be used wither individually or in combination.

Figure 25:
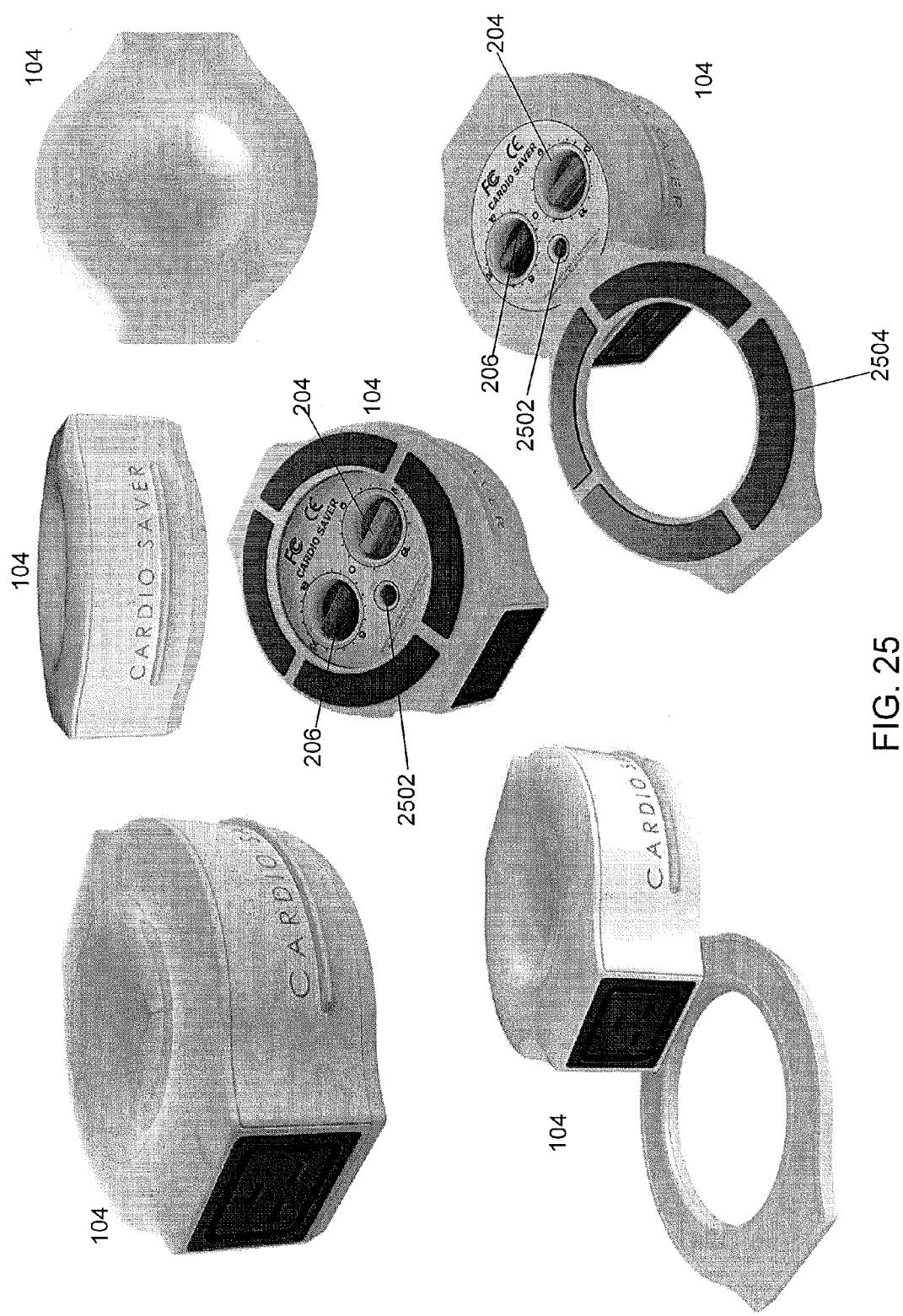
FIG. 25 illustrates various views of the current monitor in accordance with some further implementations of the current subject matter.
Figure 35:
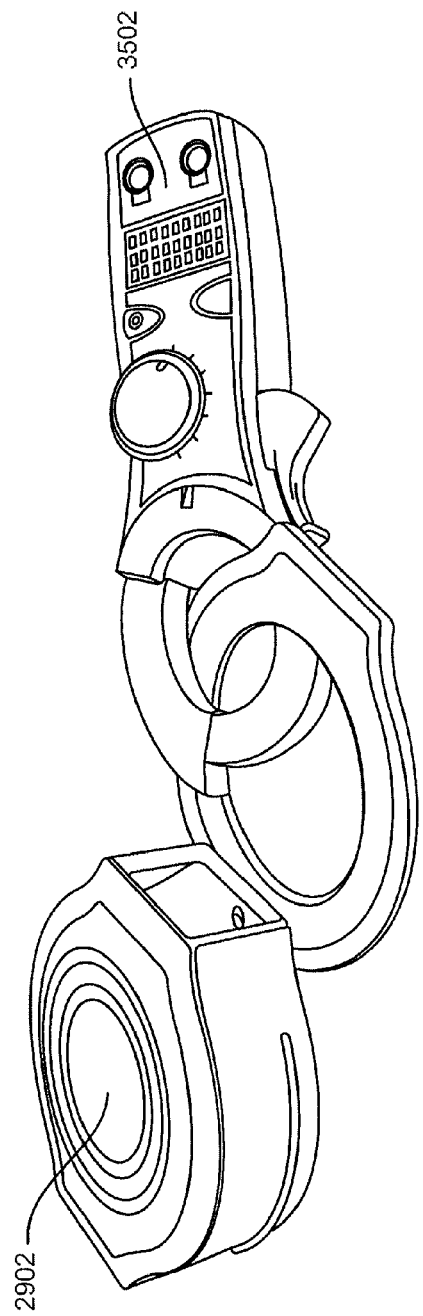
Figure 36:
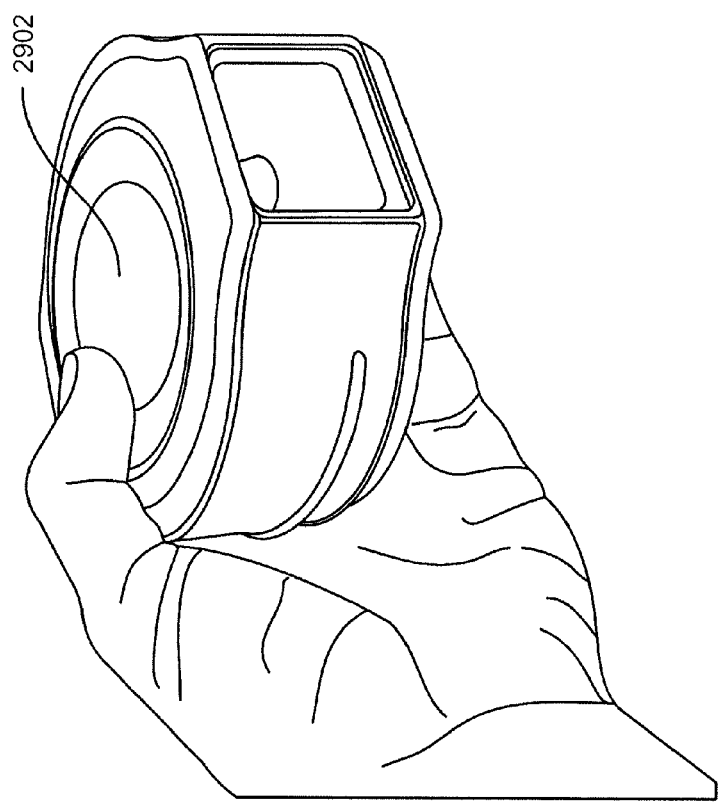
Figure 37:
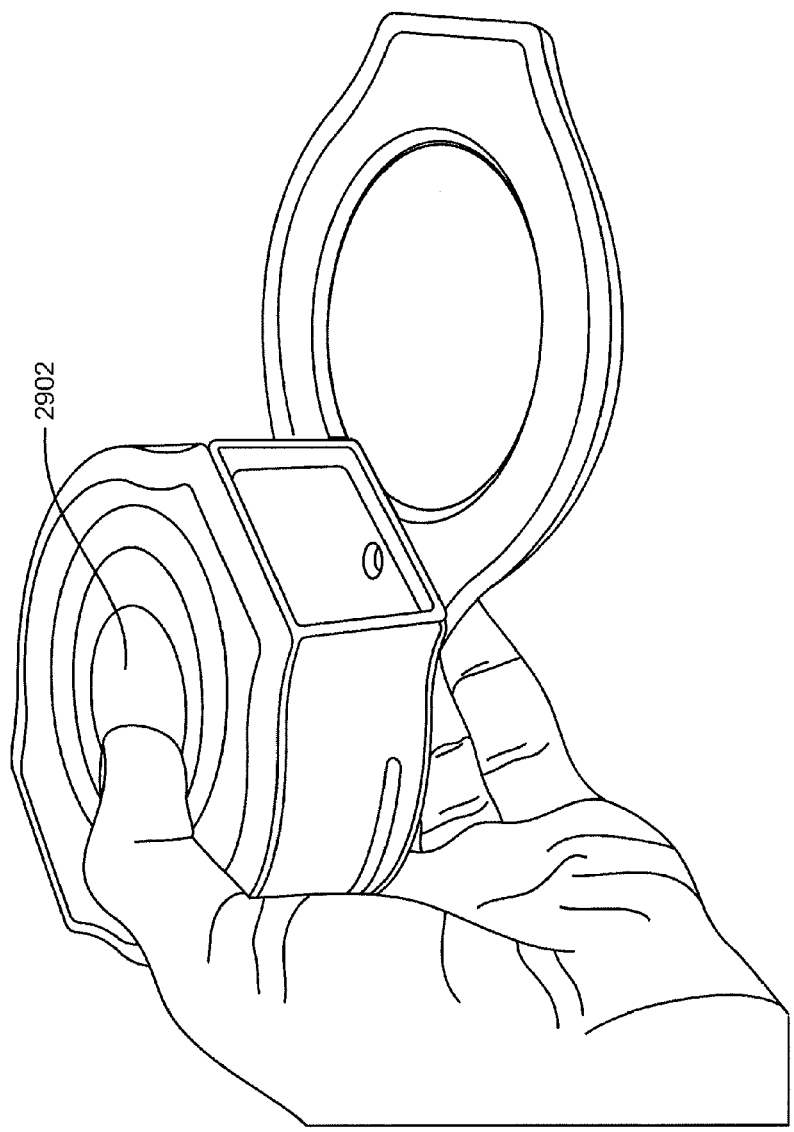

FIG. 25 illustrates various views of the current monitor 104 in accordance with some further implementations of the current subject matter. The current monitor includes a test component (such as a button) 2502. The test button 2502 is used when the device may be plugged into power outlet but may not be plugged into the electrical equipment that is being monitored using the current monitor 104. When the test button 2502 is pressed, the microcontroller 2702 (shown in FIGS. 18 and 27) is configured to utilize the zero state (or ground state) to verify that there is no current. Thus, the test button 2502, when depressed, provides a mechanism to determine that the current monitoring apparatus 100 and current monitor 104 are not malfunctioning. Further, the current monitor 104 includes a line loop 2504 that allows a user to easily access alternating current used by the electrical equipment, as a clamp meter 3502 (shown in FIG. 35) can magnetically couple with the line loop 2504.

The loop 2504 can include a live electricity wire that can be placed in the motor of the electrical equipment (for example, treadmill). The live electricity wire can form a loop. This allows a technician to measure the electricity of the morot by simply testing the electricity of the wire loop 2504. Thus, the electricity withdrawn by the electrical equipment can be measured without removing any treadmill panels.

Figure 26:
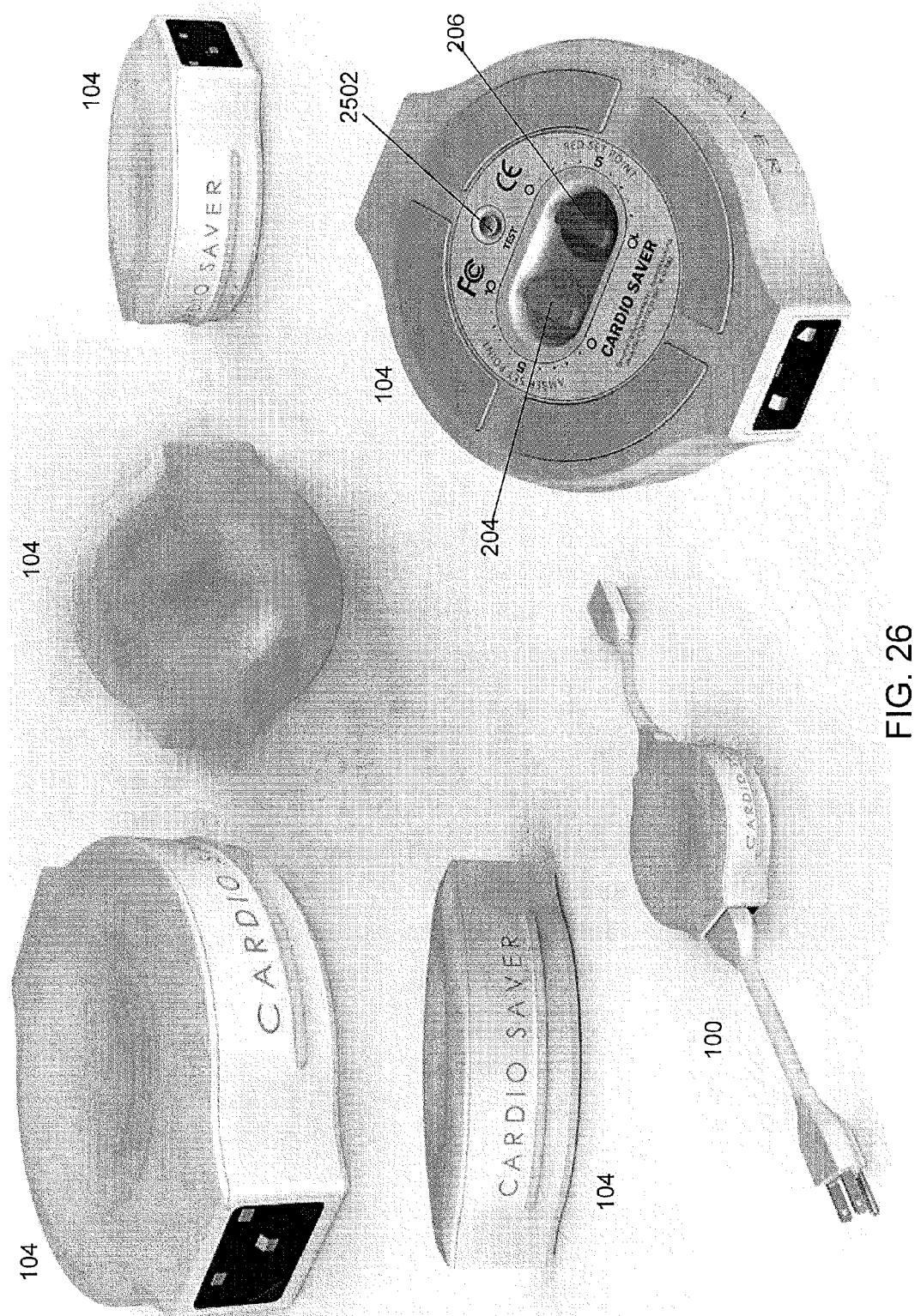
FIG. 26 illustrates various views of the current monitor in accordance with some further implementations of the current subject matter.

FIG. 26 illustrates various views of the current monitor 104 in accordance with some further implementations of the current subject matter. Further, FIG. 26 also illustrates a perspective view of a current monitoring apparatus 100.

Figure 27:
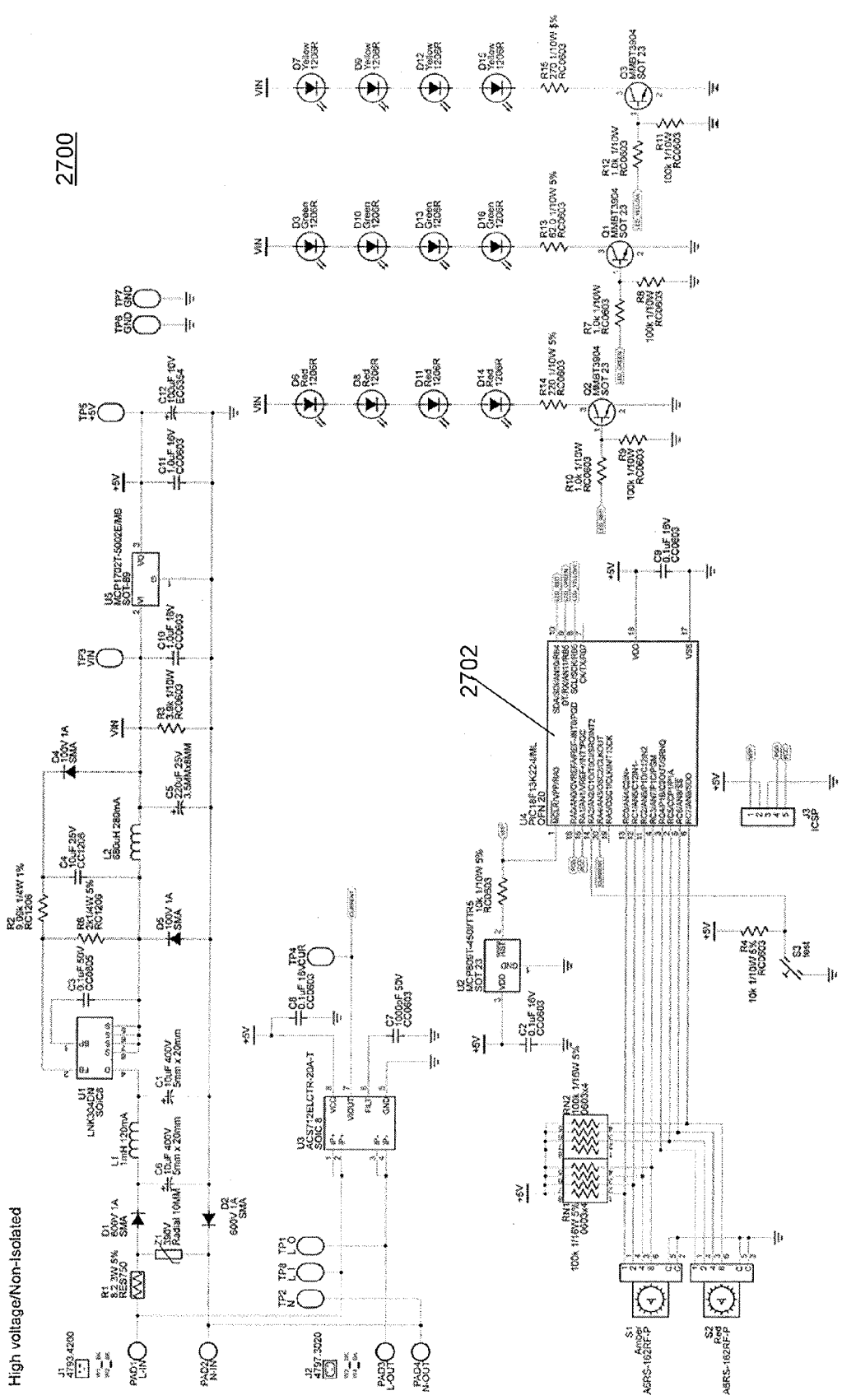
FIG. 27 illustrates an electrical/electronic circuit for the current monitoring apparatus in accordance with some further implementations of the current subject matter.

FIG. 27 illustrates an electrical/electronic circuit 2700 for the current monitoring apparatus 100 in accordance with some further implementations of the current subject matter. The electrical/electronic circuit 2700 includes a microcontroller 2702. In one implementation, the microcontroller 2702 can be a nanowatt PIC18F13K22 flash microcontroller, which has a C compiler optimized architecture. Although PIC18F13K22 microcontroller is described, other microcontrollers can also be used.

Figure 28:
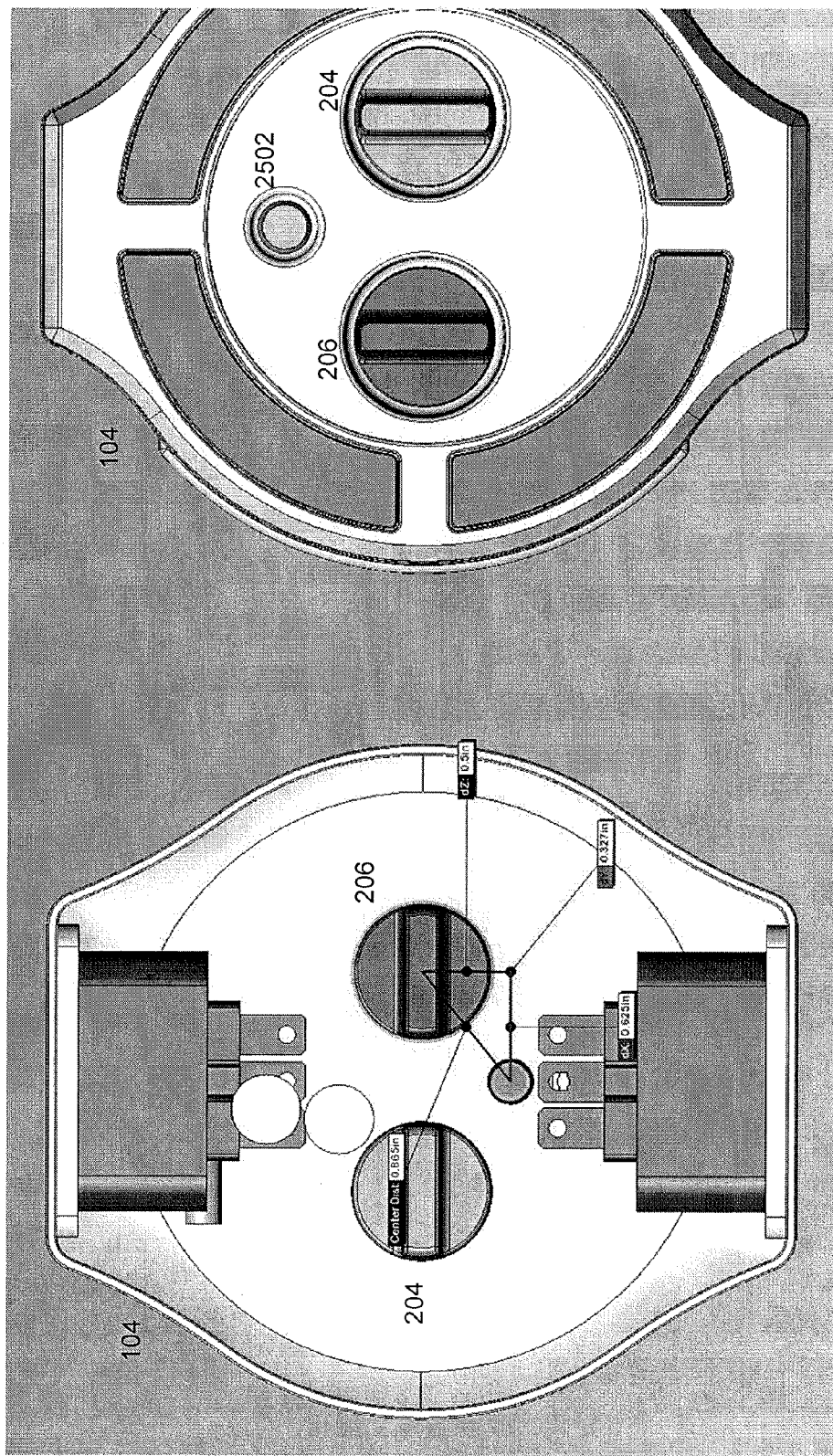
FIG. 28 illustrates an inside view of the current monitor in accordance with some implementations of the current subject matter.
Figure 29:
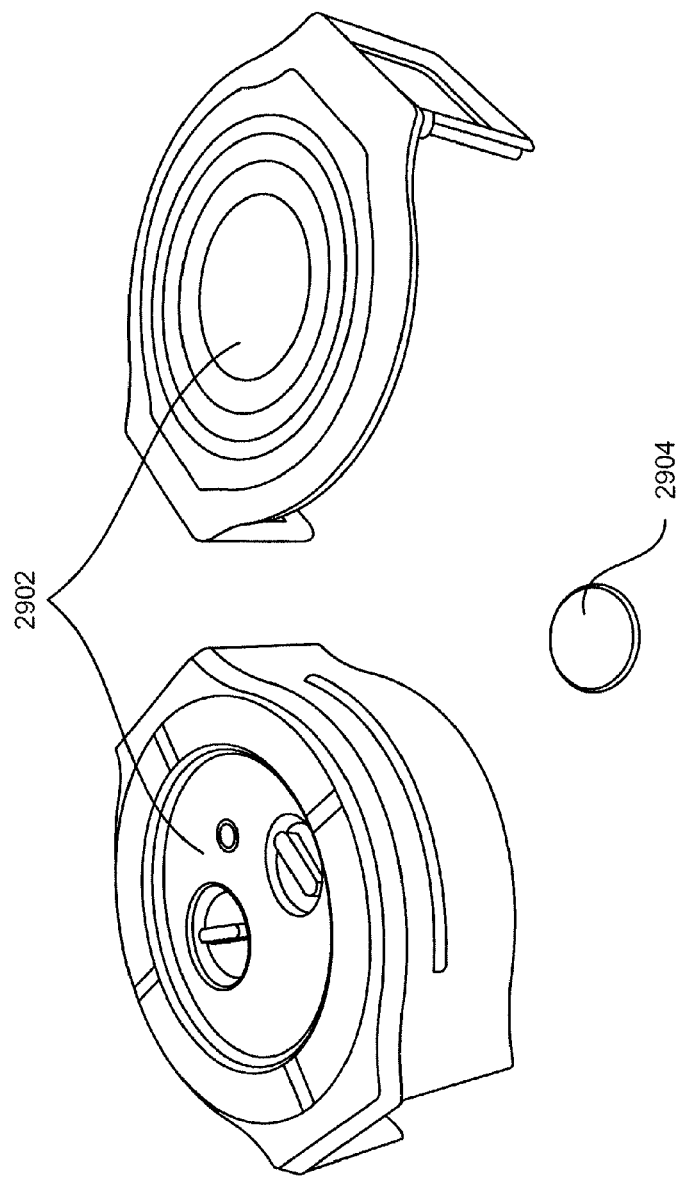
FIGS. 29-37 describe different views of a package designed for the current monitor in accordance with some implementations of the current subject matter.
Figure 30:
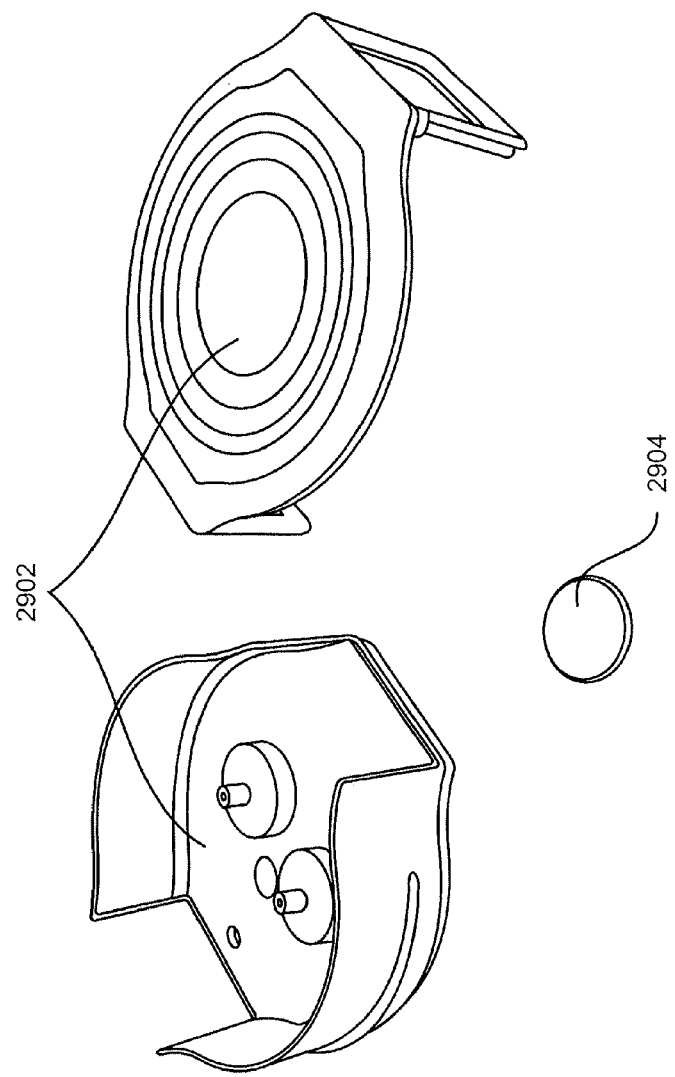
Figure 31:
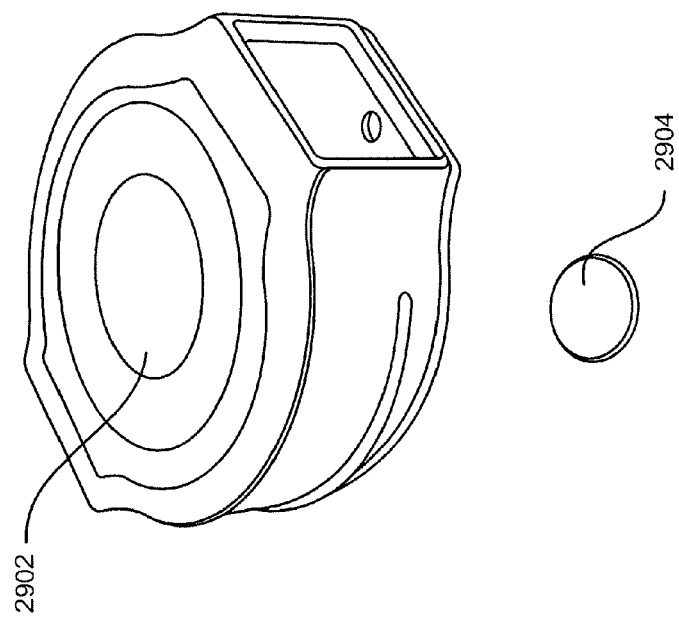
Figure 32:
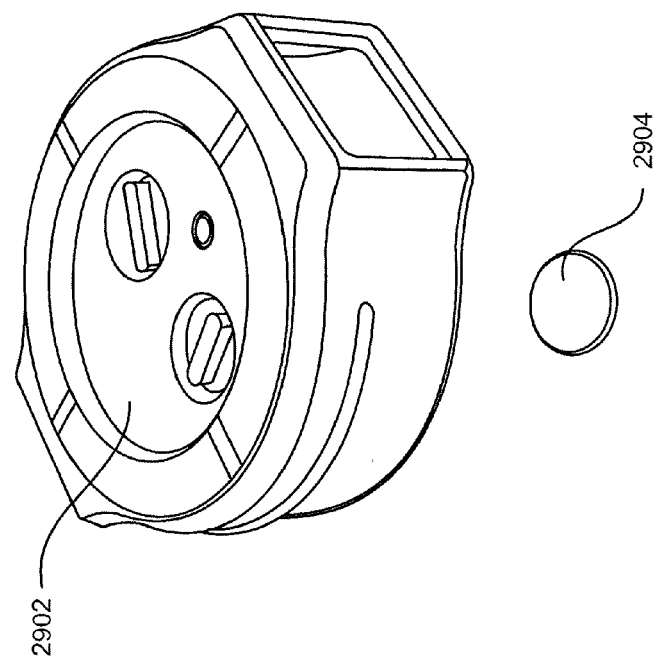
Figure 33:
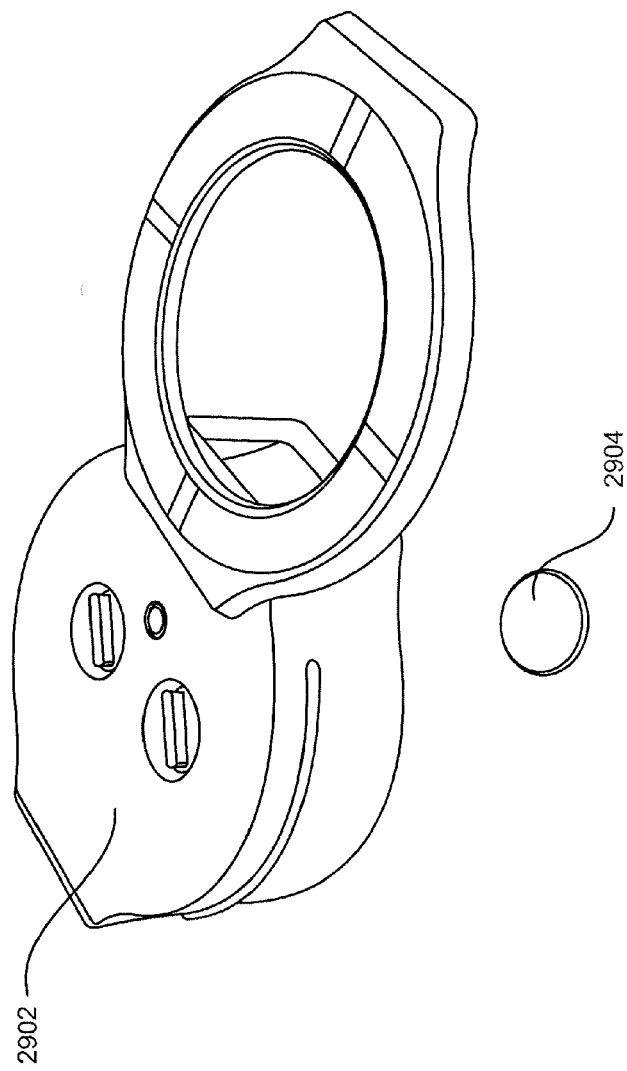
Figure 34:
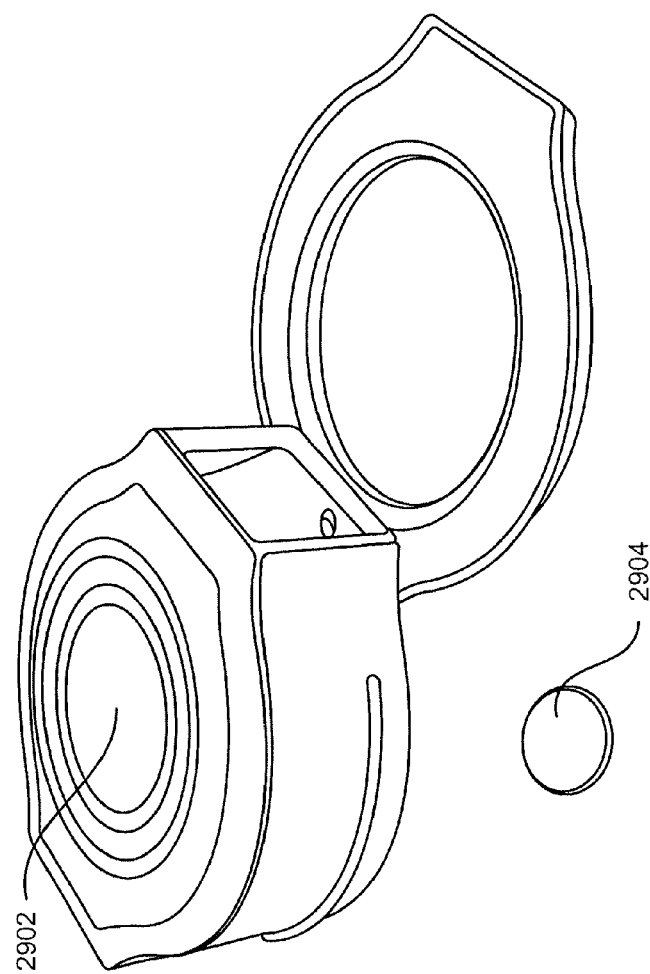

FIG. 28 illustrates an inside view of the current monitor 104 in accordance with some implementations of the current subject matter.

FIGS. 29-37 describe different views of a package 2902 designed for the current monitor 104 in accordance with some implementations of the current subject matter (a U.S. quarter 2904 is shown for size reference).

Figure 38:
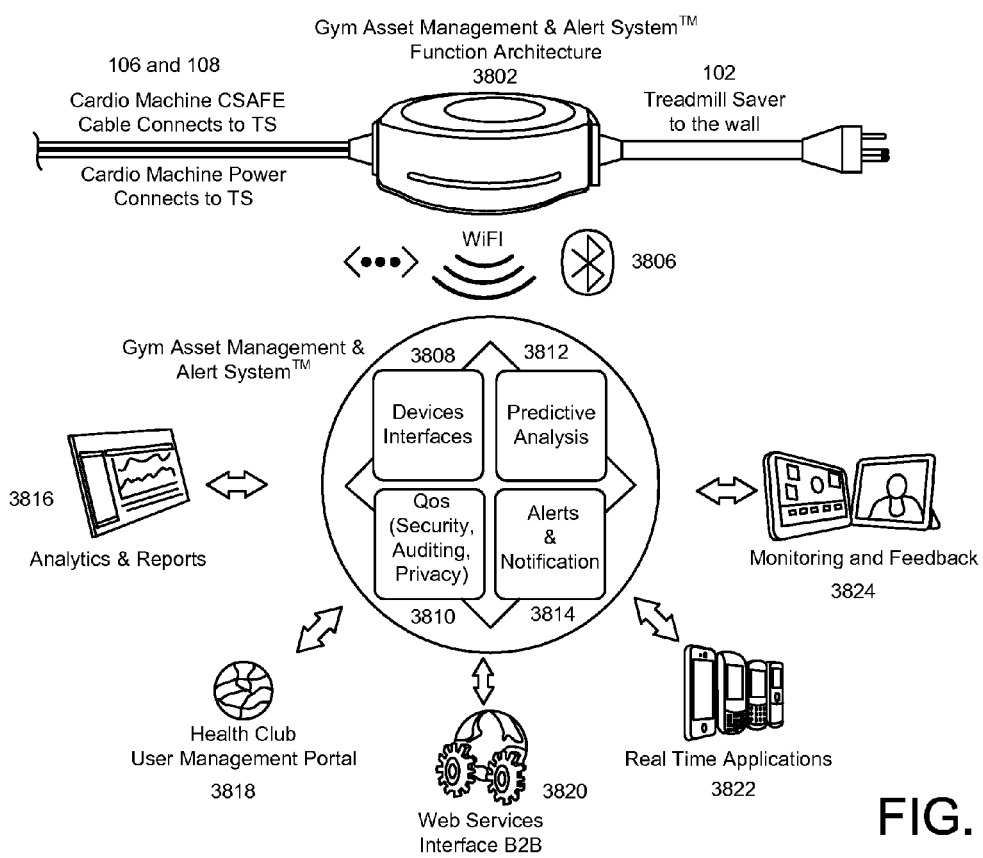
FIG. 38 illustrates a current monitor wirelessly transmitting recorded information to at least one programmable processor implementing a gym asset management and alerts system software in accordance with some implementations of the current subject matter.

FIG. 38 illustrates a current monitor 3802 (reference numeral 104 can be same as reference numeral 3802 in some implementations) wirelessly transmitting recorded information to at least one programmable processor implementing gym asset management and alerts system software 3804 in accordance with some implementations of the current subject matter. The at least one programmable processor can be a computer, a tablet computer, a mobile device, a cellular phone, a smart television, personal digital assistant, and the like. The current monitor 3802 is connected to connector 102, and female connector 106. The female connector 106 is further connected to male connector 108. The current monitor 3802 can transmit, either wirelessly or through a wire, information to at least one programmable processor, such as gym asset management and alert system software 3804. In case of wireless transmission, this transmission of information can be performed over wireless network 3806, such as internet, intranet, wide area network, local area network, metropolitan area network, Bluetooth network, infrared network, or the like. The gym asset management and alert system software 3804 can include device interfaces 3808, quality of service module 3810 that is associated with security, auditing and privacy, predictive analysis module 3812, and an alerts and notification module 3814. The gym asset management and alert system software 3804 can be used to prepare analytics and reports 3816, communicate with health club user management portal 3818, present information on a web services interface (business to business) 3820, interact with real time applications 3822, and perform monitoring and feedback 3824. This implementation of the current monitor 3802 is described in some more detail below.

The current monitor 3802 is configured to work with communication technologies, such as WiFi, Bluetooth, ZigBee, Ethernet, and the like. Such a configuration uses the gym asset management and alert system software 3804 that allows the current monitor 3802 to communicate with external devices, such as computers, mobile devices, personal digital assistants, tablet computers, and the like.

The gym asset management and alert system software 3804 coupled with current monitor 3802 allows tracking of usage (in units of days, hours, minutes, seconds, and the like) of the electrical equipment, issuing of alerts, tracking of preventative maintenance schedules, repairs, costs, and the like.

The gym asset management and alert system software 3804 can be configured to operate within an intranet or internet/cloud based network that can monitor a plurality (for example, even a high number) of current monitors 3802.

On each current monitor 3802, a unique identification (for example, media access control address—MAC ID) can be implemented in its firmware so as to uniquely associate each current monitor 3802 with respective electrical equipment.

Each current monitor 3802 and connected electrical equipment can carry a pair of tags (for example, bar code, radio frequency ID—RFID) that can be scanned at a time of installation. These tags can be used to provide the link between the current monitor 3802 and electrical equipment (for example, treadmill). Such identification can allow an alert and notification server to identify the electrical equipment, its type, age, product class, history, parts history, warranty information, preventative schedule, maintenance schedule, repair schedule, and the like information.

The gym asset management and alert system software 3804 can have multiple levels of functionality for a single location (for example, a single gym) of electrical equipment. In other implementations, the gym asset management and alert system software 3804 can have multiple levels of functionality for multiple locations (for example, multiple gymnasiums) of different electrical equipments.

As the current monitor 3802 tracks the connected electrical equipment, the current monitor 3802 sends tracked information to the gym asset management and alert system software 3804. If a trigger associated with the gym asset management and alert system software 3804 is activated, the gym asset management and alert system software 3804 can send at least one of an email, text, page, alert or any other form of communication appropriate. A particular form of communication (for example, email, text, page, alert, or the like) can be specified by a user of a device (for example, a wireless device) implementing the gym asset management and alert system software 3804.

The gym asset management and alert system software 3804 can be associated with a mobile applications (for example, application on a cellular phone, such as an IPHONE or another smart phone) enabling additional functionality and monitoring.

Users of a processor/device implementing the gym asset management and alert system software 3804 can have access to the gym asset management and alert system software 3804 via technologies such as mobile devices, computer terminals, tablets, other intranet, internet or networked devices, and the like.

The current monitor 3802 can add connectivity that can allow the current monitor 3802 to communicate with external devices by using industry standard interfaces such as Ethernet, WiFi, Bluetooth, power line communication (PLC), Zig-Bee, and the like. In addition, a proprietary radio frequency (RF) link can be used in place of an industry standard interface.

The added connectivity can provide status as well as control of one or more operations of the current monitor 3802. Status data can be collected by a microcontroller 2702 and transmitted using connectivity interface at a predetermined interval as well as at any status change.

Commands can be received by the microcontroller 2702 via the added connectivity to allow control of the current monitor 3802.

Ethernet connectivity can be achieved with addition of a 802.3 MAC/PHY integrated circuit (IC) capable of 10/100/1000 Mbit. In addition to the MAC/PHY integrated circuit, the appropriate magnetics and RJ45 connector can be added to allow physical connection to the Ethernet network. The microcontroller 2702 can interface with the MAC/PHY using the industry standard TCP/IP. With the addition of Ethernet, status and control of the current monitor 3802 can be achieved with a device connected to the network.

WiFi connectivity can be achieved with the addition of a WiFi 802.11b/g/n transceiver module which interfaces directly with the microcontroller. WiFi modules can provide an all-inclusive connectivity to the wireless network. With the addition of WiFi, status and control of the current monitor 3802 can be achieved with a device connected to the network.

Bluetooth connectivity can be achieved with the addition of a Bluetooth module which can interface directly with the microcontroller. Bluetooth modules can provide an all-inclusive connectivity to another Bluetooth device. The current monitor 3802 can be paired with a Bluetooth hub, which can connect with multiple devices configured to provide a Bluetooth network. With the addition of Bluetooth, status and control of the current monitor 3802 can be achieved with a device connected to the hub.

Power Line Communication (PLC) can provide network connectivity using the power lines to which the current monitor 3802 can be connected. PLC connectivity can be achieved with the addition of a PLC modem which can interface directly with the microcontroller 2702. The PLC modem can interface with the power line using an analog front end (AFE) and appropriate magnetics. With the addition of the PLC, status and control of the current monitor 3802 can be achieved with a device connected to the power line network.

Zigbee connectivity can be achieved with the addition of a Zigbee 802.15.4 module, which can interface directly with the microcontroller 2702. Zigbee modules can provide an all-inclusive connectivity to the wireless network. With the addition of Zigbee, status and control of the current monitor 3802 can be achieved with a device connected to the Zigbee network.

Proprietary radio frequency (RF) connectivity can be achieved with the addition of an industrial, scientific and medical (ISM) band radio frequency transceiver which interfaces directly with the microcontroller 2702. The communications protocol can be achieved with software associated with the microcontroller 2702 while the RF transceiver provides the wireless connectivity. The current monitor 3802 can be linked with a proprietary hub which can connect with multiple devices providing a wireless network. With the addition of the proprietary RF network, status and control of the current monitor 3802 can be achieved with a device connected to the hub.

Figure 39:
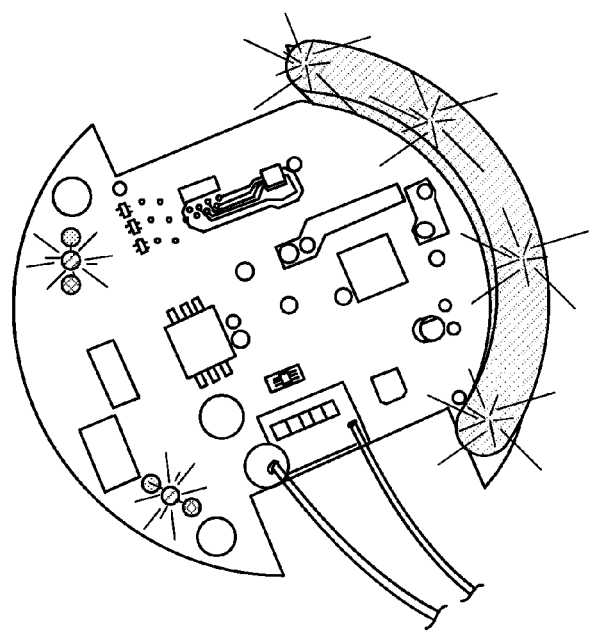
FIG. 39 illustrates electronic circuitry implementing the current monitor in accordance with some implementations of the current subject matter.

FIG. 39 illustrates electronic circuitry 3900 implementing the current monitor 104 in accordance with some implementations of the current subject matter. The electronic circuitry 3900 can include 12 LEDs such that there are 4 LEDs for each color (yellow, green, and red). FIG. 39 illustrates a perspective view of electronic circuitry 3900, wherein the 4 yellow LEDs are activated/glowing.

Figure 40:
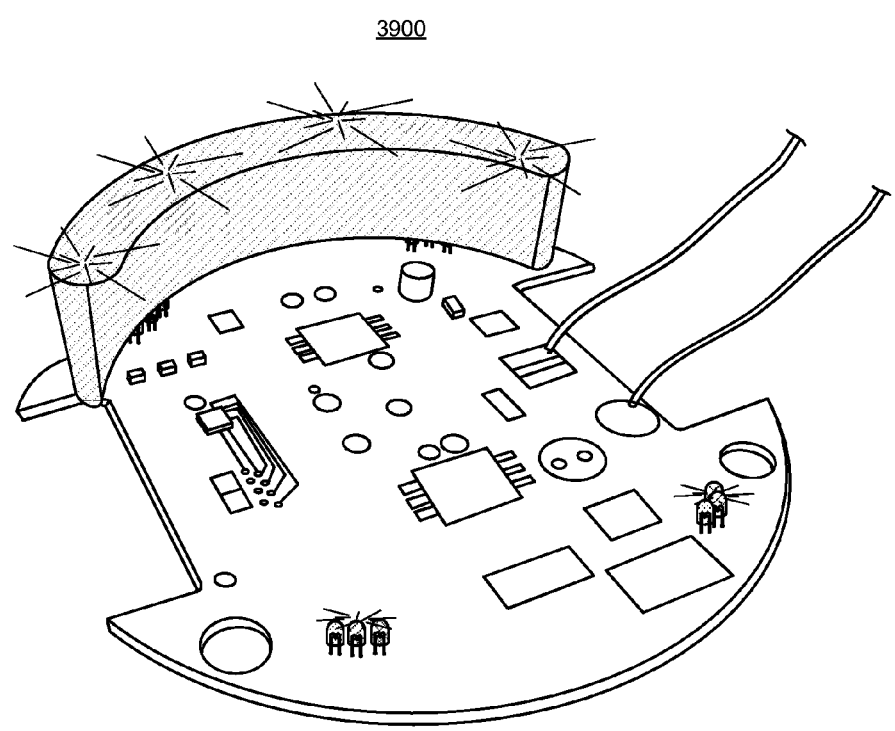
FIG. 40 illustrates another perspective view of the electronic circuitry, wherein the 4 yellow LEDs are activated/glowing in accordance with some implementations of the current subject matter.

FIG. 40 illustrates another perspective view of the electronic circuitry 3900, wherein the 4 yellow LEDs are activated/glowing in accordance with some implementations of the current subject matter.

Figure 41:
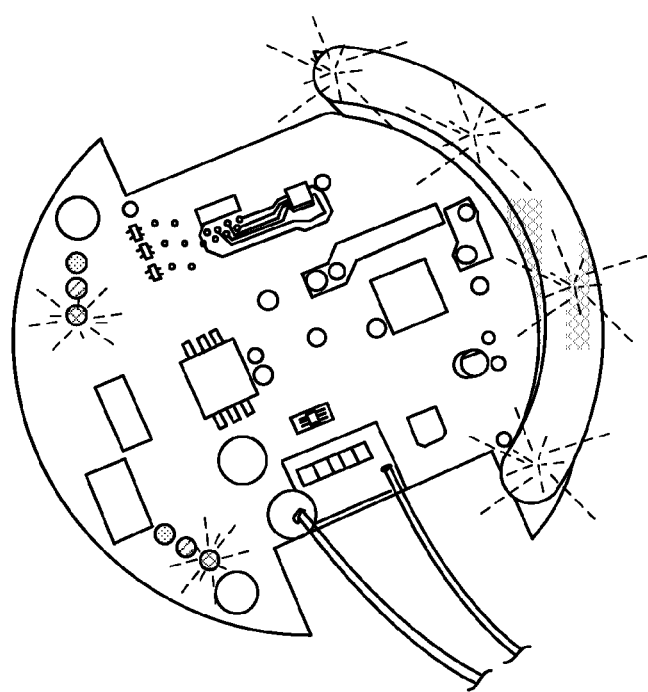
FIG. 41 illustrates a perspective view of the electronic circuitry, wherein the 4 green LEDs are activated/glowing in accordance with some implementations of the current subject matter.

FIG. 41 illustrates a perspective view of the electronic circuitry 3900, wherein the 4 green LEDs are activated/glowing in accordance with some implementations of the current subject matter.

Figure 42:
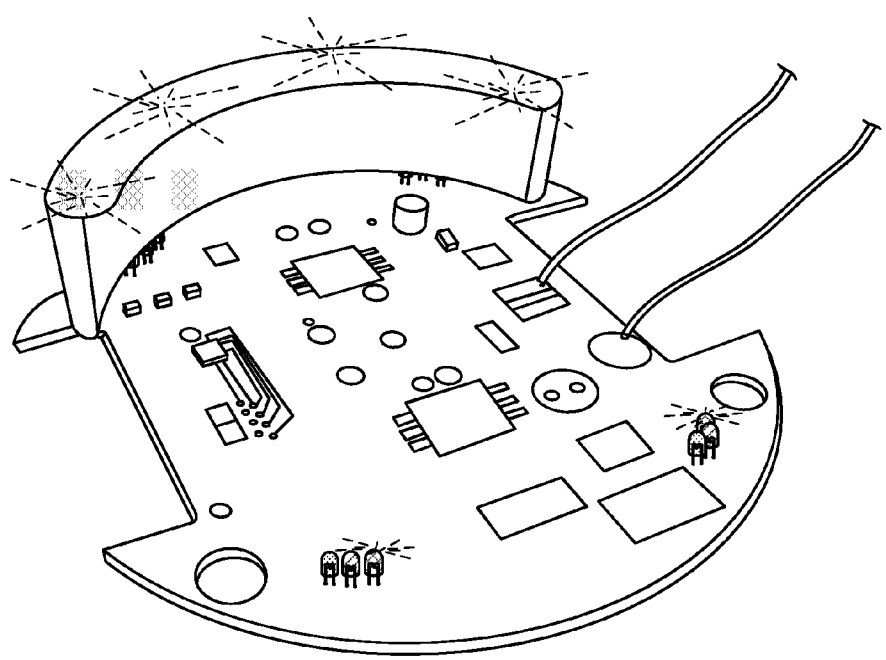
FIG. 42 illustrates another perspective view of the electronic circuitry, wherein the 4 green LEDs are activated/glowing in accordance with some implementations of the current subject matter.

FIG. 42 illustrates another perspective view of the electronic circuitry 3900, wherein the 4 green LEDs are activated/glowing in accordance with some implementations of the current subject matter.

Figure 43:
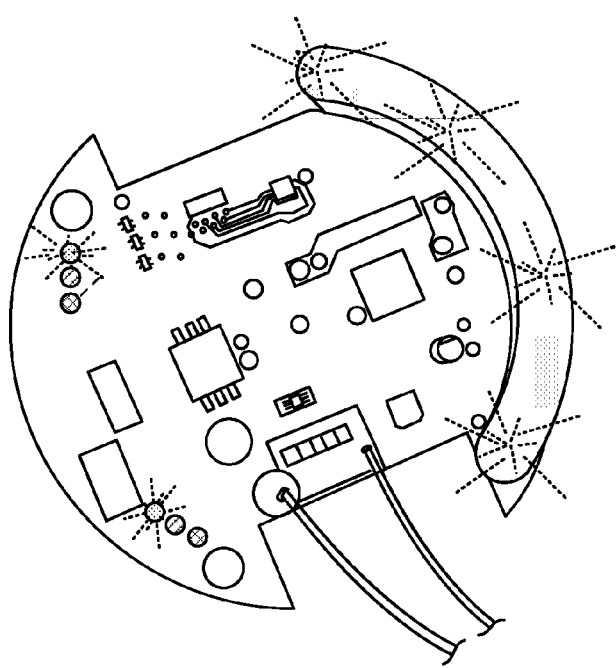
FIG. 43 illustrates a perspective view of the electronic circuitry, wherein the 4 red LEDs are activated/glowing in accordance with some implementations of the current subject matter.

FIG. 43 illustrates a perspective view of the electronic circuitry 3900, wherein the 4 red LEDs are activated/glowing in accordance with some implementations of the current subject matter.

Figure 44:
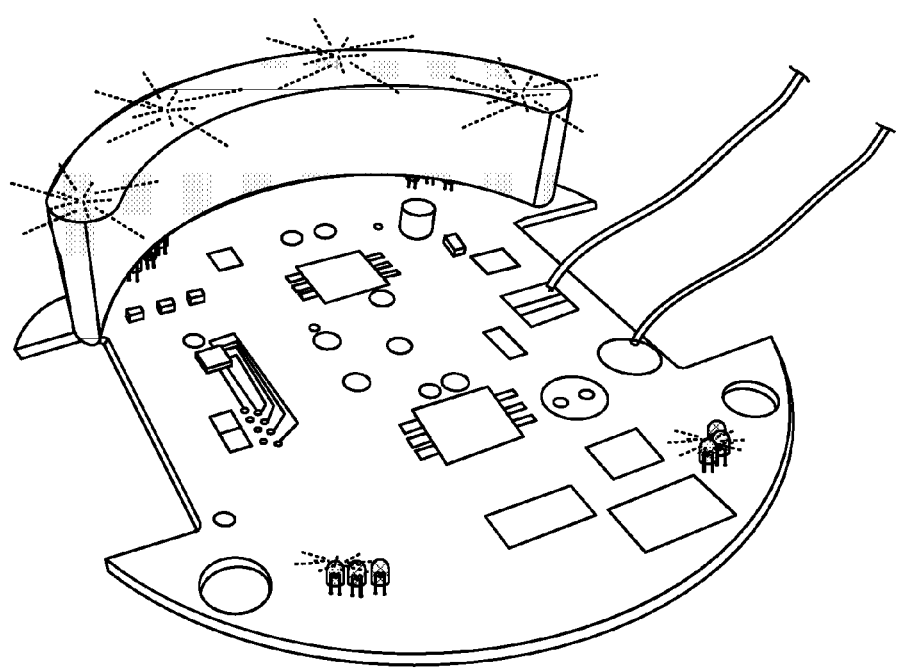
FIG. 44 illustrates a perspective view of the electronic circuitry, wherein the 4 red LEDs are activated/glowing in accordance with some implementations of the current subject matter.

FIG. 44 illustrates a perspective view of the electronic circuitry 3900, wherein the 4 red LEDs are activated/glowing in accordance with some implementations of the current subject matter.

Figure 45:
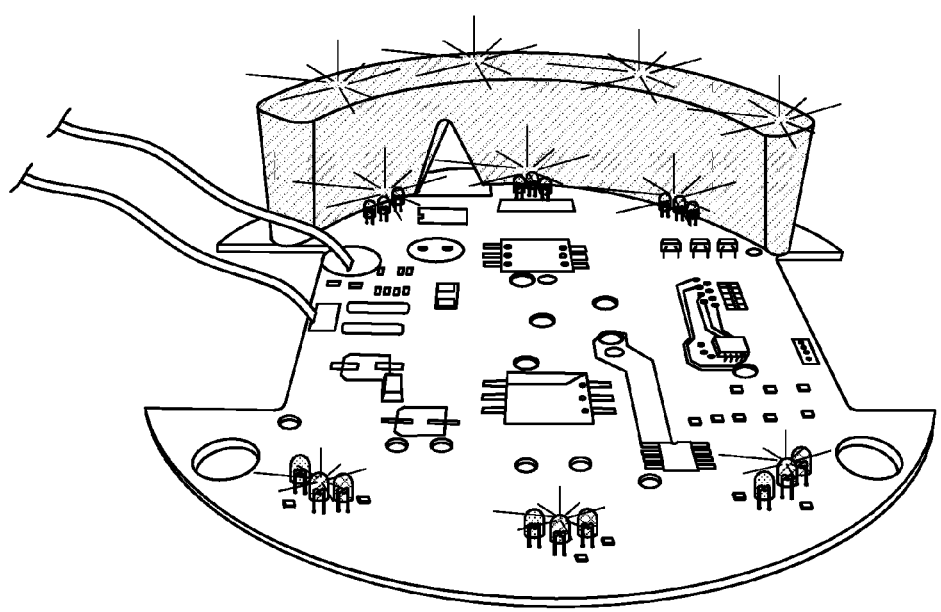
FIG. 45 illustrates electronic circuitry implementing the current monitor in accordance with some implementations of the current subject matter.

FIG. 45 illustrates electronic circuitry 4500 implementing the current monitor 104 in accordance with some implementations of the current subject matter. The electronic circuitry 4500 can include 18 LEDs such that there are 6 LEDs for each color (yellow, green, and red). FIG. 45 illustrates a perspective view of electronic circuitry 4500, wherein the 6 yellow LEDs are activated/glowing.

Figure 46:
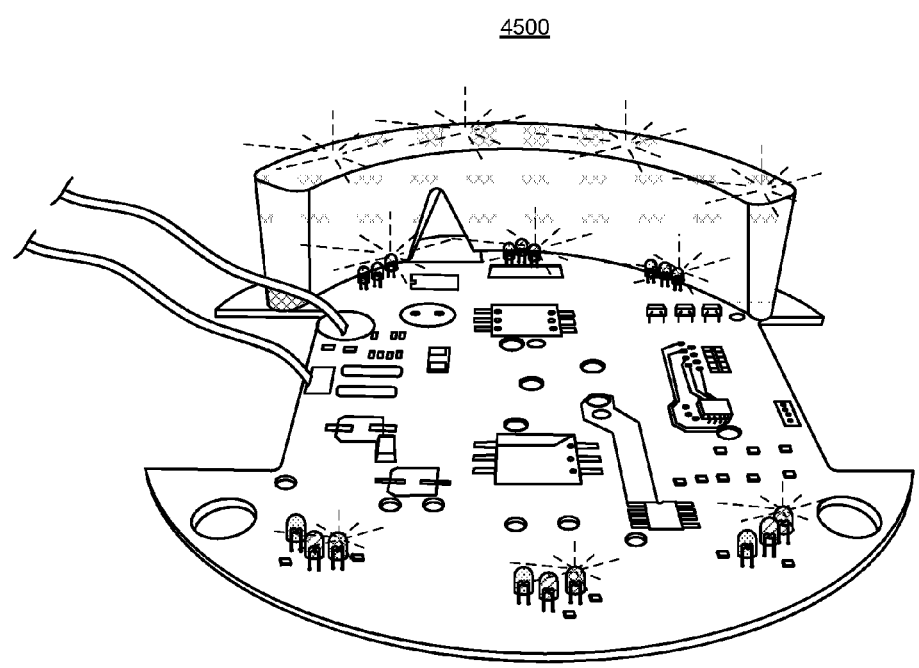
FIG. 46 illustrates a perspective view of the electronic circuitry, wherein the 6 green LEDs are activated/glowing in accordance with some implementations of the current subject matter.

FIG. 46 illustrates a perspective view of the electronic circuitry 4500, wherein the 6 green LEDs are activated/glowing in accordance with some implementations of the current subject matter.

Figure 47:
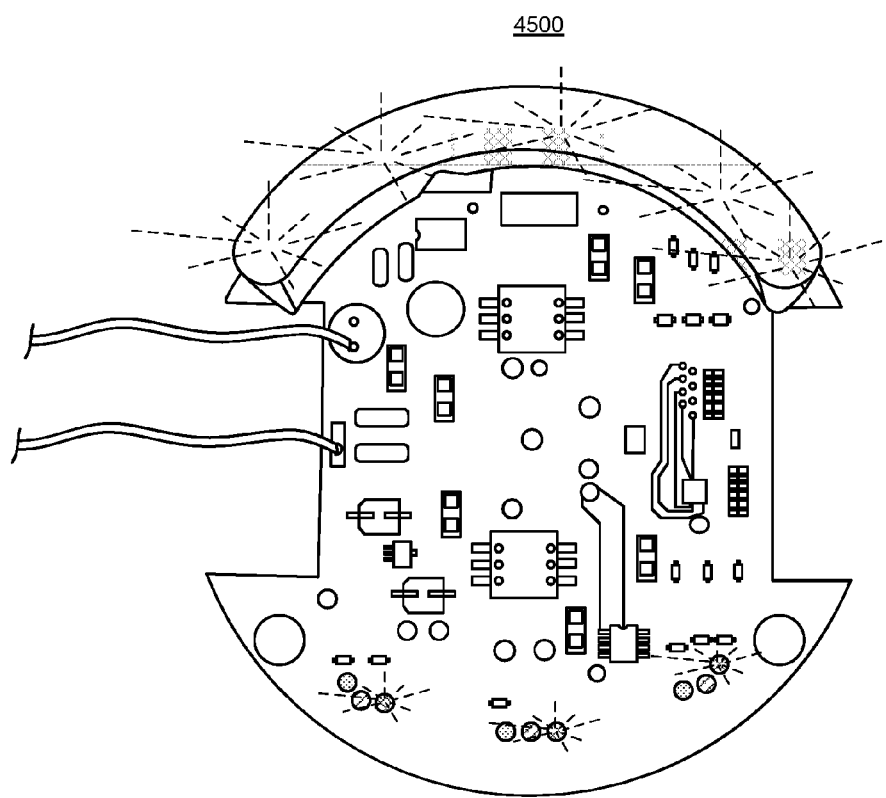
FIG. 47 illustrates another perspective view of the electronic circuitry, wherein the 6 green LEDs are activated/glowing in accordance with some implementations of the current subject matter.

FIG. 47 illustrates another perspective view of the electronic circuitry 4500, wherein the 6 green LEDs are activated/glowing in accordance with some implementations of the current subject matter.

Figure 48:
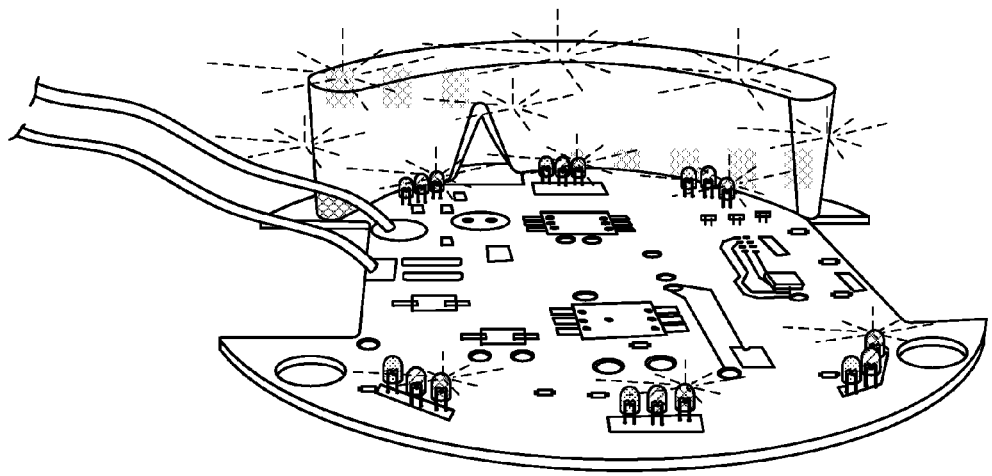
FIG. 48 illustrates a perspective view of the electronic circuitry, wherein the 6 green LEDs are activated/glowing in accordance with some implementations of the current subject matter.

FIG. 48 illustrates a perspective view of the electronic circuitry 4500, wherein the 6 green LEDs are activated/glowing in accordance with some implementations of the current subject matter.

Figure 49:
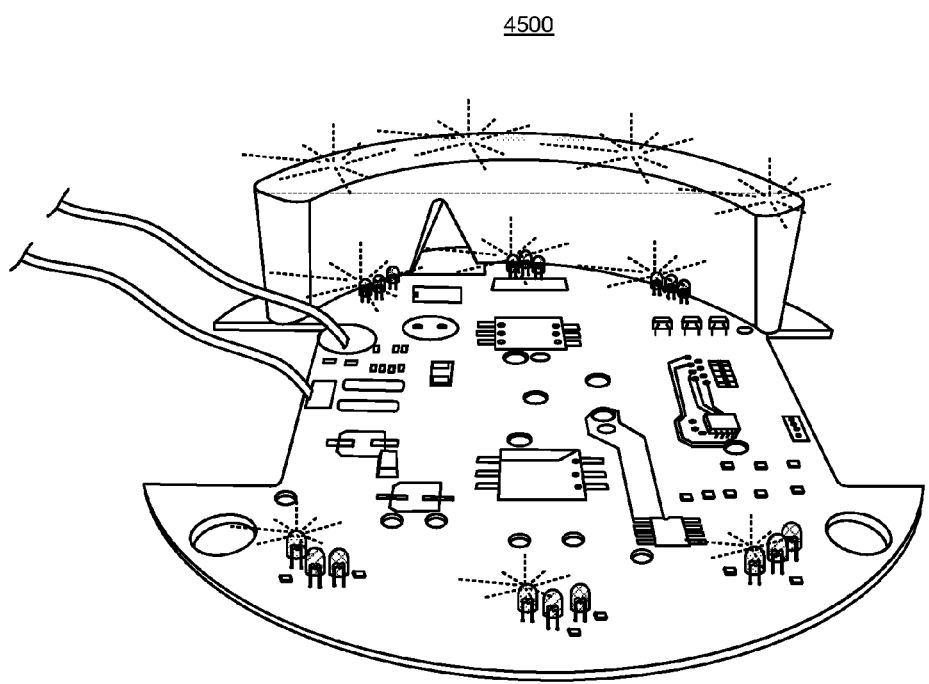
FIG. 49 illustrates a perspective view of the electronic circuitry, wherein the 6 red LEDs are activated/glowing in accordance with some implementations of the current subject matter.

FIG. 49 illustrates a perspective view of the electronic circuitry 4500, wherein the 6 red LEDs are activated/glowing in accordance with some implementations of the current subject matter.

Figure 50:
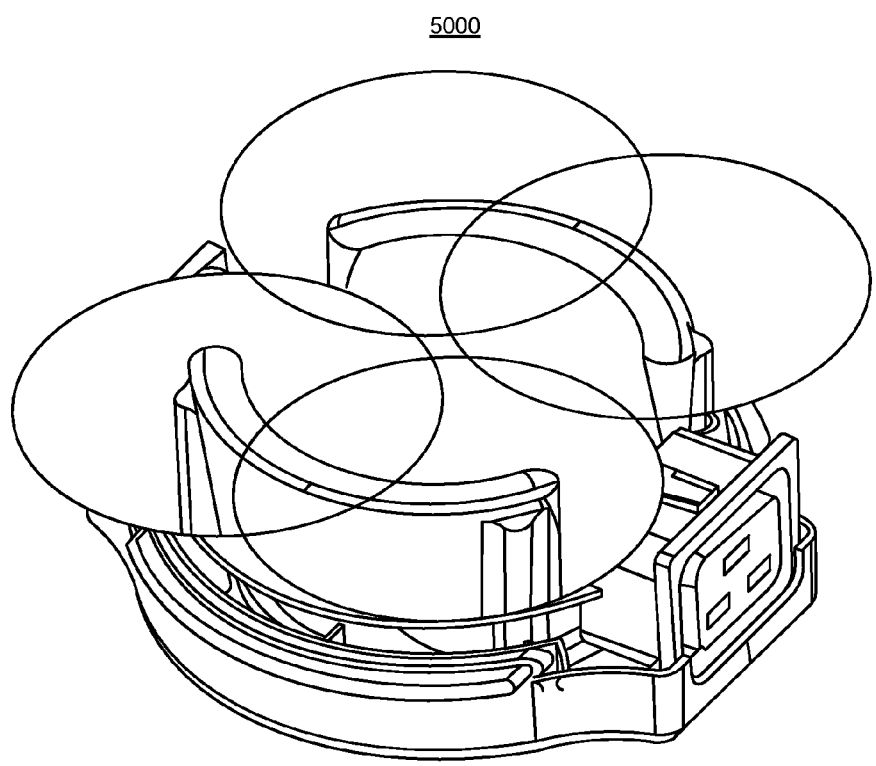
FIG. 50 illustrates a one hundred and twenty degree illumination pattern implemented on the current monitor in accordance with some implementations of the current subject matter.

FIG. 50 illustrates a one hundred and twenty degree illumination pattern 5000 implemented on the current monitor 104 in accordance with some implementations of the current subject matter.

Figure 51:
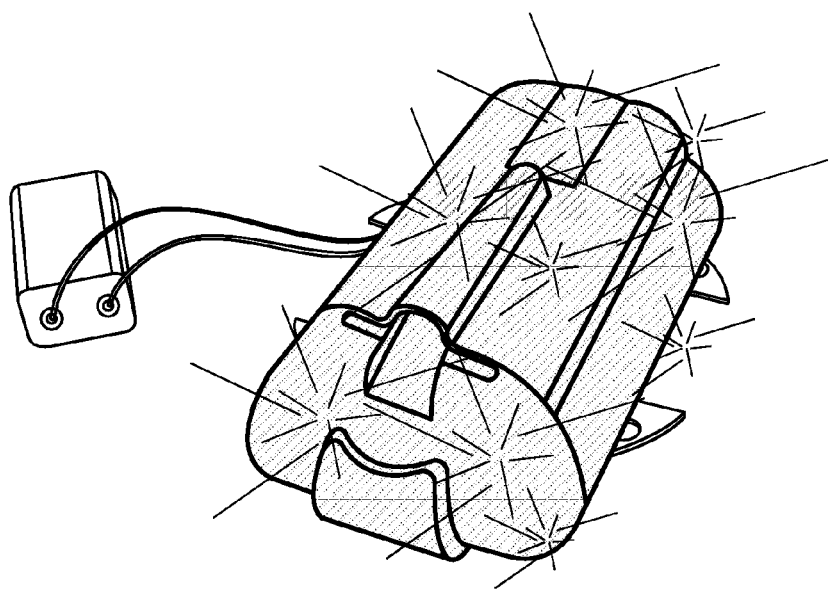
FIG. 51 illustrates activated yellow LEDs of a packaged current monitor in accordance with some implementations of the current subject matter.

FIG. 51 illustrates activated yellow LEDs of a packaged current monitor 104 in accordance with some implementations of the current subject matter.

Figure 52:
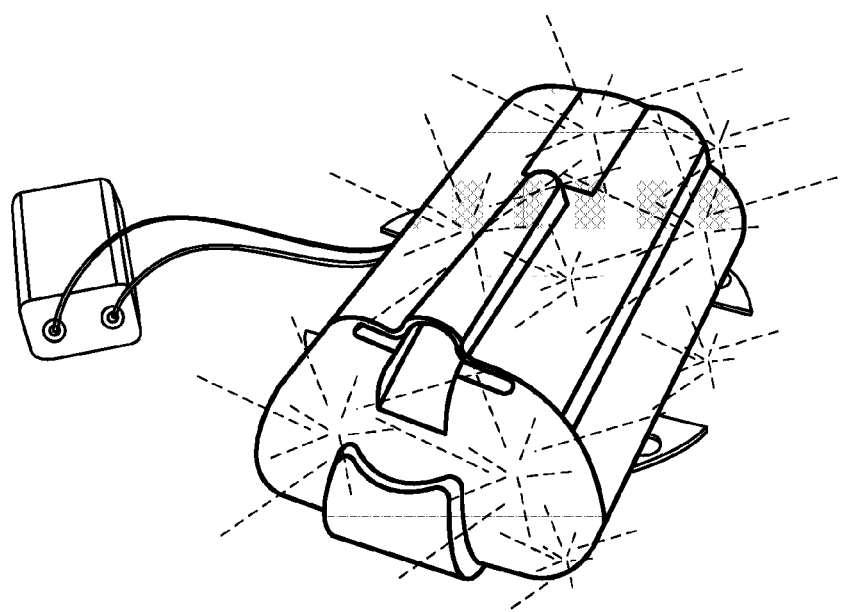
FIG. 52 illustrates activated green LEDs of a packaged current monitor 104 in accordance with some implementations of the current subject matter.

FIG. 52 illustrates activated green LEDs of a packaged current monitor 104 in accordance with some implementations of the current subject matter.

Figure 53:
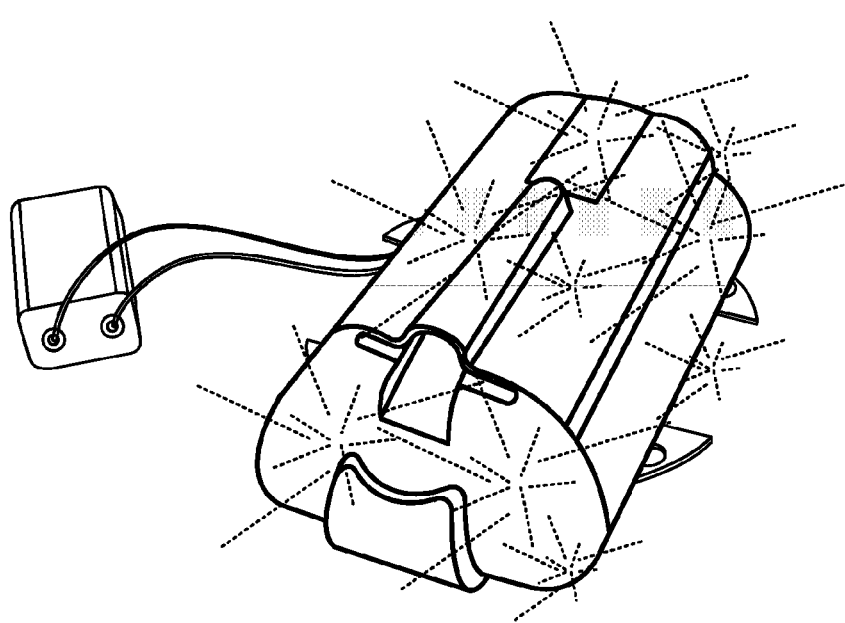
FIG. 53 illustrates activated red LEDs of a packaged current monitor 104 in accordance with some implementations of the current subject matter.
Figure 54:
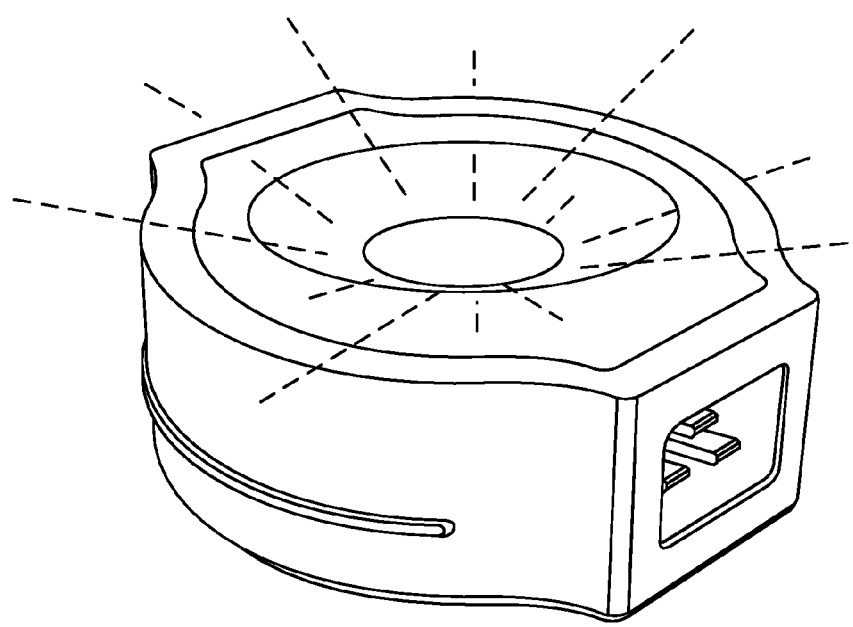
FIGS. 54-68 illustrate packaging of current monitor 104 and associated devices in accordance with some implementations of the current subject matter.
Figure 55:
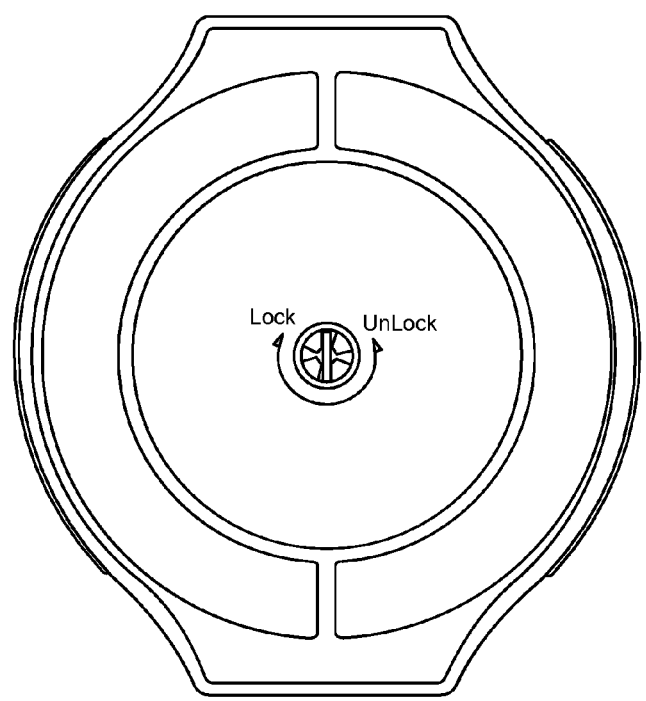
Figure 56:
Figure 57:
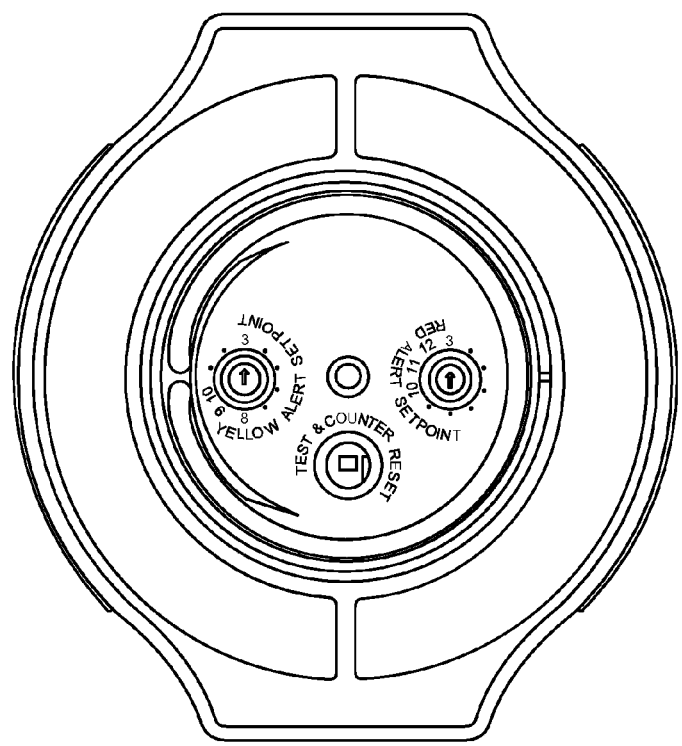
Figure 58:
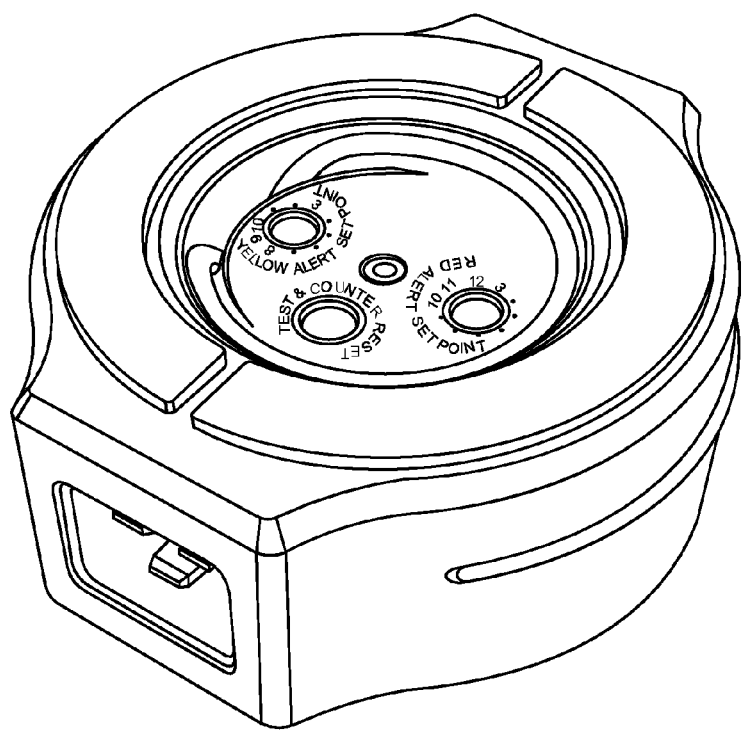
Figure 59:
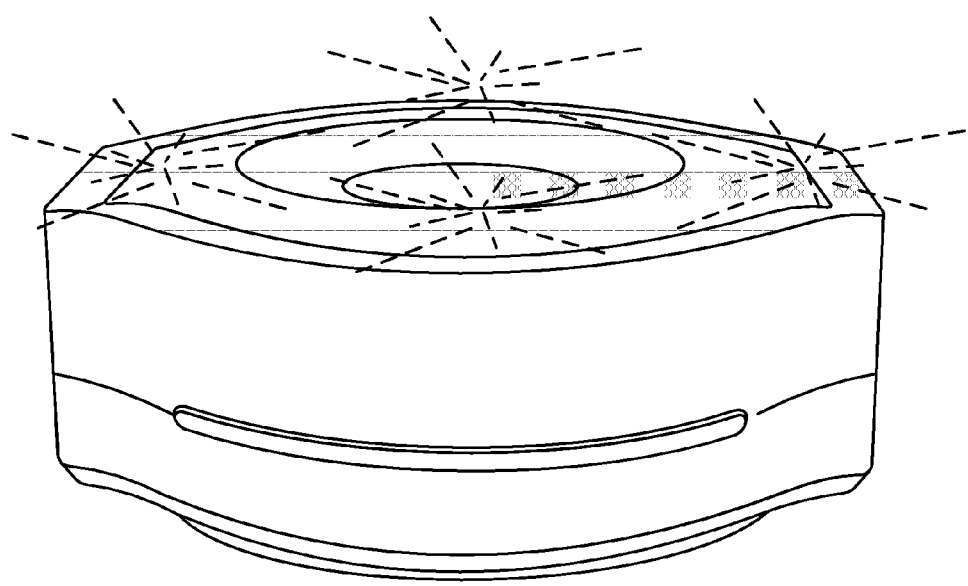
Figure 60:
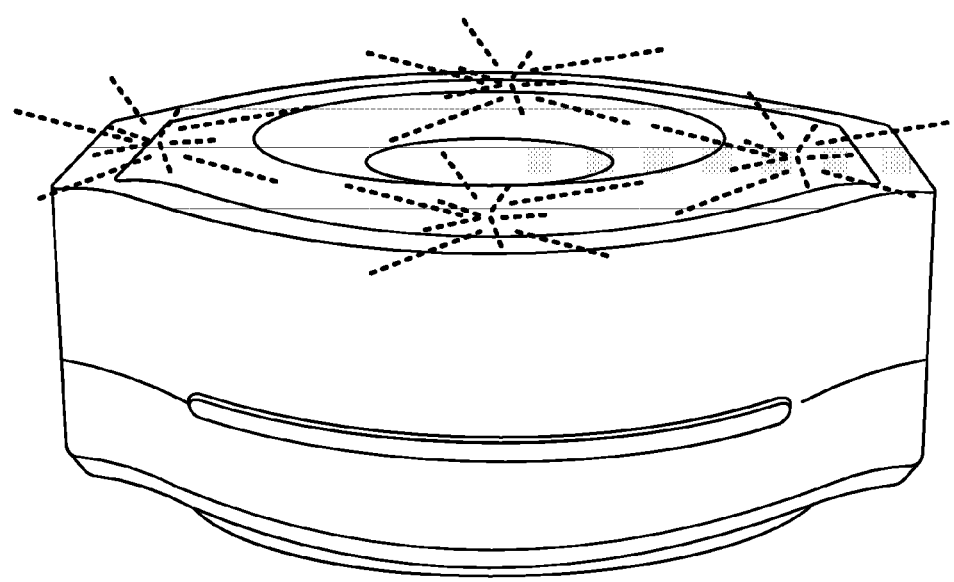
Figure 61:
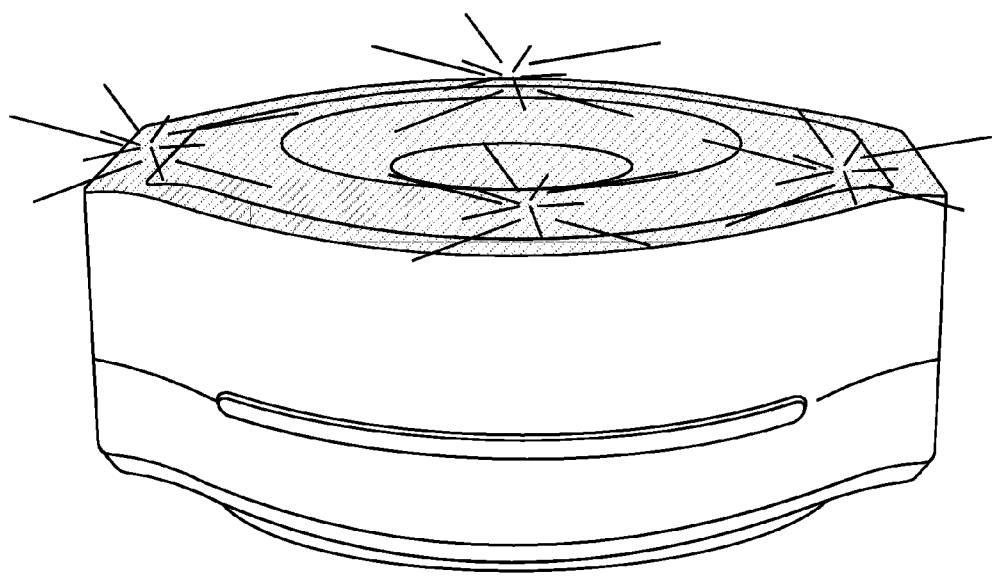
Figure 62:
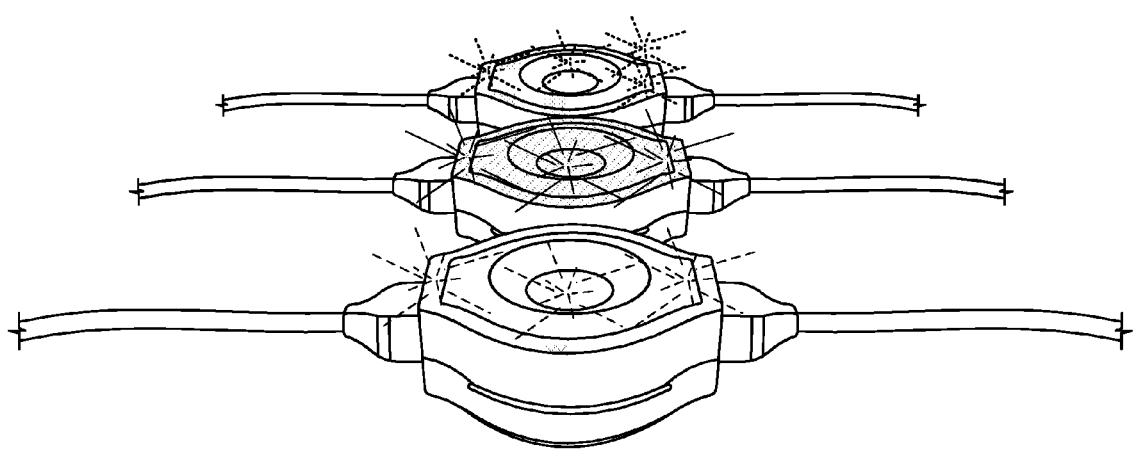
Figure 63:
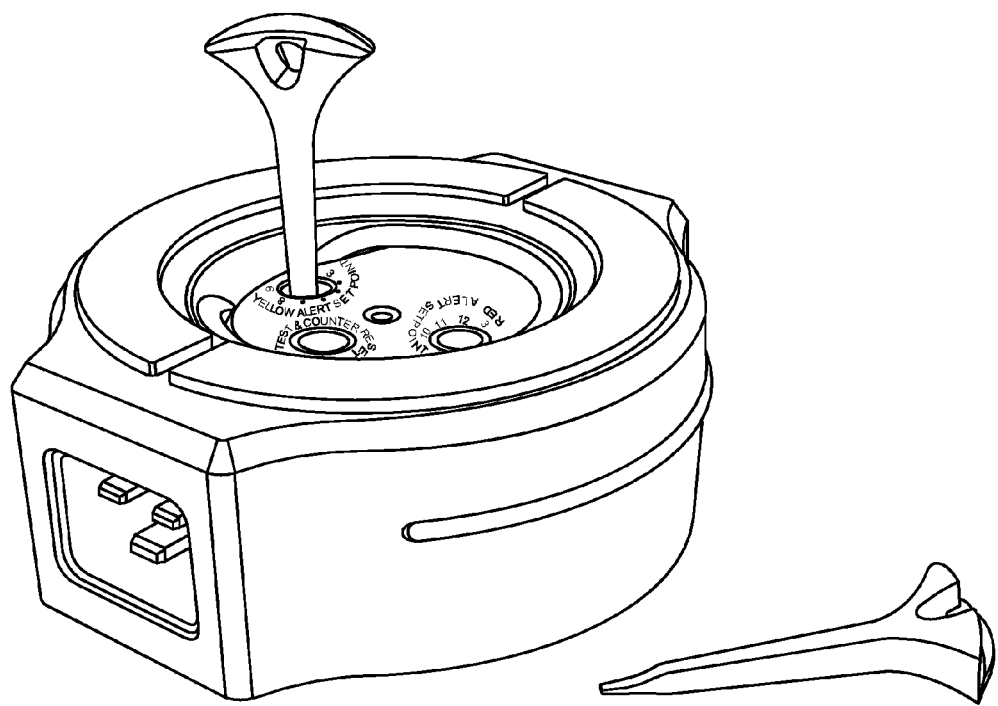
Figure 64:
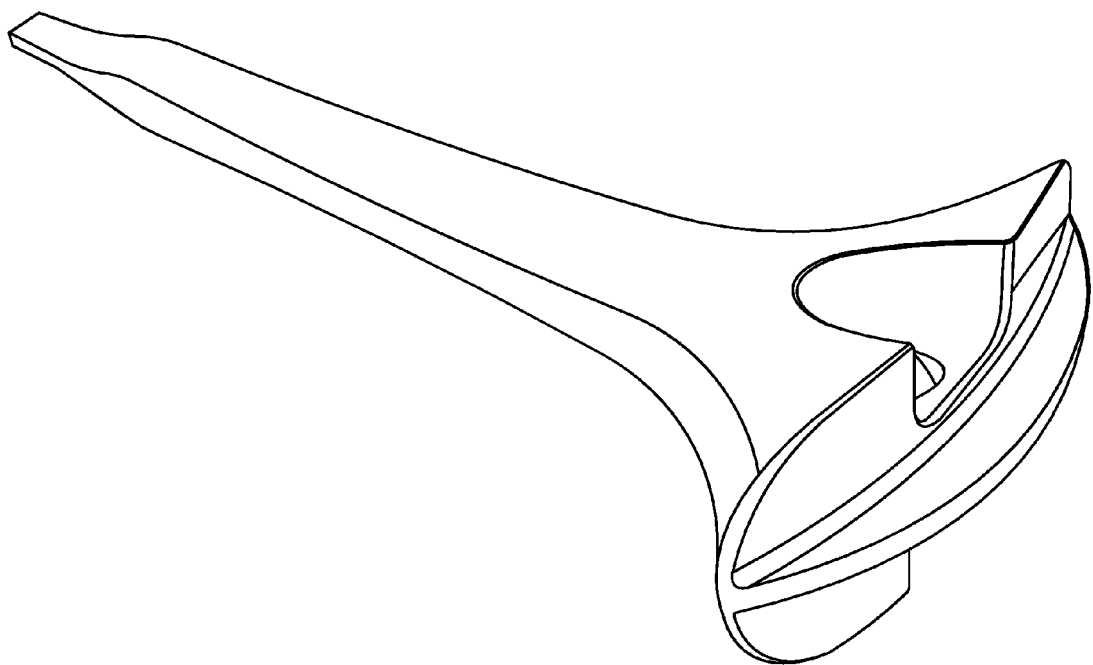
Figure 65:
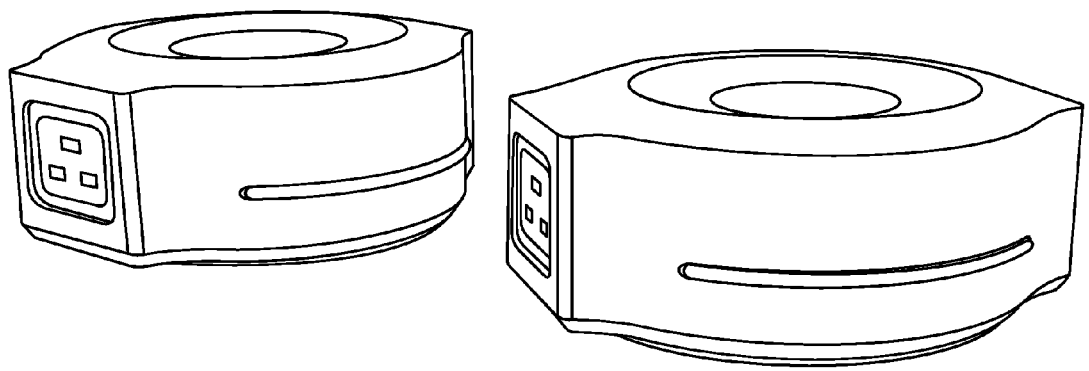
Figure 66:
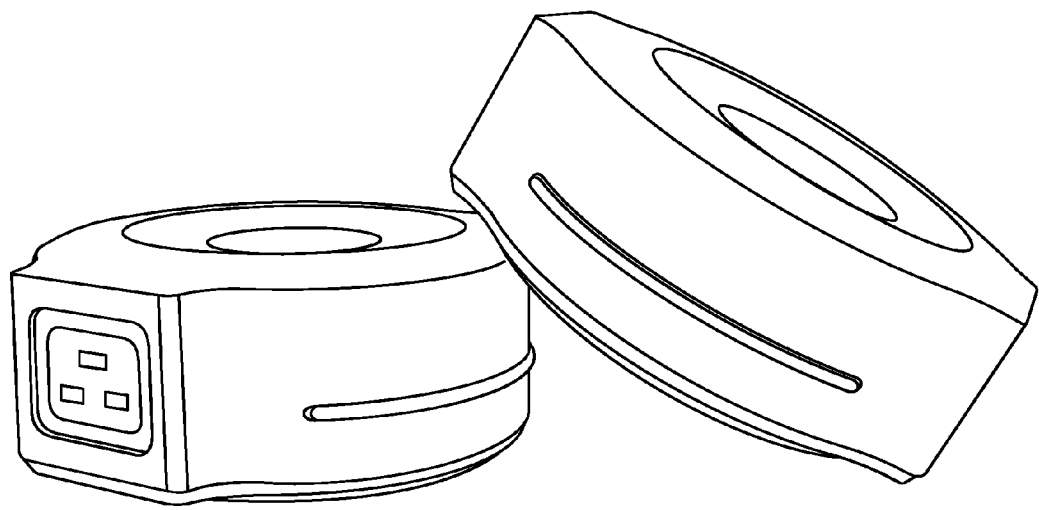
Figure 67:
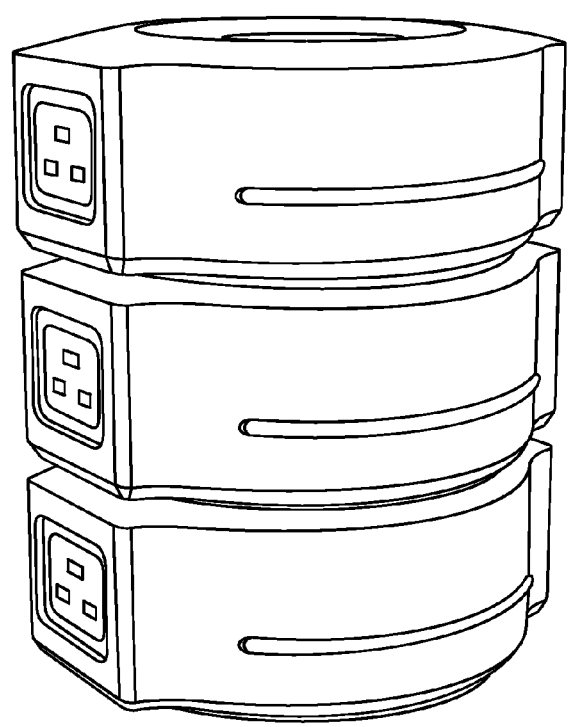
Figure 68:
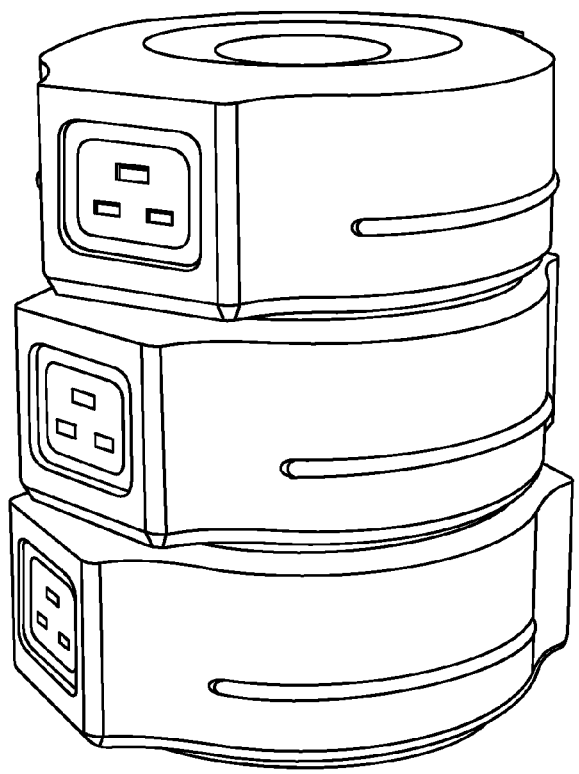

FIG. 53 illustrates activated red LEDs of a packaged current monitor 104 in accordance with some implementations of the current subject matter.

FIGS. 54-68 illustrate packaging of current monitor 104 and associated devices in accordance with some implementations of the current subject matter.

Various implementations of the subject matter described herein may be realized in digital electrical/electronic circuitry, integrated circuitry, specially designed ASICs (application specific integrated circuits), computer hardware, firmware, software, and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method comprising:
obtaining, at an electrical circuit and in accordance with a current requirement of an electrical equipment, current from a power source;
measuring, by an ammeter within the electrical circuit and at a plurality of times, values of the obtained current; and
transmitting, by a transmitter within the electrical circuit and to a management system, the values of the obtained current and timestamps characterizing the times when the current values are measured, the management system being configured to:
receive, by a receiver of the management system, the transmitted values of the current and the corresponding timestamps;
store, in a database associated with the management system, the values of the current and the timestamps;
perform, by one or more processors of the management system and using the stored values of the current and the timestamps, a statistical analysis to generate a graphical report, the generated report characterizing a performance of the electrical equipment;
predict, using one or more predictive models and based on the statistical analysis, a current intake by the electrical equipment at a specific time in future, the current intake at the specific time in future characterizing a predicted performance of the electrical equipment at the specific time in future; and
generate, by an alarm generator within the management system, an alarm to alert a user when the current intake at the specific time in future is more than a predetermined threshold.

2. The method of claim 1, wherein the values of the current and the timestamps are transmitted to the management system in real-time, the transmission being via a communication network.

3. The method of claim 1, wherein the values of the current and the timestamps are transmitted to the management system after regular intervals of time, the transmission being via a communication network.

4. The method of claim 1, further comprising:
comparing, using the electrical circuit, the obtained current with at least one of a first threshold and a second threshold;
if the obtained current is less than a first threshold, activating one or more light emitting diodes of a first color;
if the obtained current is equal to or more than the first threshold and is less than a second threshold, activating one or more light emitting diodes of a second color; and
if the obtained current is equal to or more than the second threshold, activating one or more light emitting diodes of a third color.

5. The method of claim 4, wherein:
at least one of the first threshold and the second threshold are user-adjustable, the electrical circuit further comprising a test component that provides a mechanism to determine that the electrical circuit is functioning properly;
the electrical circuit comprises one or more multichannel switches to control activation of one of the one or more light emitting diodes of the first color, the one or more light emitting diodes of the second color, and the one or more light emitting diodes of the third color; and
the electrical circuit includes a latching mechanism that enables the color of the activated one or more light emitting diodes to be retained after the electrical equipment stops being used.

6. The method of claim 5, wherein:
the latching mechanism is reset by disconnecting the electrical circuit from the power source;
the retained color is latched until the latching mechanism is reset; and
previously deactivated one or more light emitting diodes are disabled from reactivation until the latching mechanism is reset.

7. A method comprising:
obtaining, at an electrical circuit and in accordance with a current requirement of an electrical equipment, current from a power source;
measuring, by an ammeter within the electrical circuit and at a plurality of times, values of the obtained current;
transmitting, by a transmitter within the electrical circuit and to a management system, the values of the obtained current and timestamps characterizing the times when the current values are measured; and
comparing, using the electrical circuit, the obtained current with at least one of a first threshold and a second threshold;
if the obtained current is less than a first threshold, activating one or more light emitting diodes in a first manner;
if the obtained current is equal to or more than the first threshold and is less than a second threshold, activating one or more light emitting diodes in a second manner; and
if the obtained current is equal to or more than the second threshold, activating one or more light emitting diodes in a third manner.

8. The method of claim 7, wherein the values of the current and the timestamps are transmitted to the management system in real-time, the transmission being via a communication network.

9. The method of claim 7, wherein the values of the current and the timestamps are transmitted to the management system after regular intervals of time, the transmission being via a communication network.

10. The method of claim 7, wherein:
- at least one of the first threshold and the second threshold are user-adjustable, the electrical circuit further comprising a test component that provides a mechanism to determine that the electrical circuit is functioning properly;
- the electrical circuit comprises one or more multichannel switches to control activation of one of the one or more light emitting diodes configured to be activated in the first manner, the one or more light emitting diodes configured to be activated in the second manner, and the one or more light emitting diodes configured to be activated in the third manner; and
- the electrical circuit includes a latching mechanism that enables the manner of the activated one or more light emitting diodes to be retained after the electrical equipment stops being used.

11. The method of claim 10, wherein:
- the latching mechanism is reset by disconnecting the electrical circuit from the power source;
- the retained manner is latched until the latching mechanism is reset; and
- previously deactivated one or more light emitting diodes are disabled from reactivation until the latching mechanism is reset.

* * * * *